(12) United States Patent
Sakai et al.

(10) Patent No.: US 6,495,392 B2
(45) Date of Patent: Dec. 17, 2002

(54) PROCESS FOR PRODUCING A SEMICONDUCTOR DEVICE

(75) Inventors: Akira Sakai, Kyoto-fu (JP); Yasushi Fujioka, Kyoto-fu (JP); Shotaro Okabe, Nara (JP); Masahiro Kanai, Tokyo (JP); Tadashi Sawayama, Kyoto-fu (JP); Yuzo Koda, Kyoto-fu (JP); Takahiro Yajima, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/911,172

(22) Filed: Jul. 23, 2001

(65) Prior Publication Data

US 2002/0016017 A1 Feb. 7, 2002

Related U.S. Application Data

(63) Continuation of application No. 09/645,036, filed on Aug. 24, 2000, now abandoned.

(30) Foreign Application Priority Data

Aug. 24, 1999 (JP) .............................. 11-236281

(51) Int. Cl.⁷ ............................................... H01L 21/00
(52) U.S. Cl. ........................................... 438/96; 438/57
(58) Field of Search .............................. 438/57, 58–98; 136/258; 257/463, 461; 320/101

(56) References Cited

U.S. PATENT DOCUMENTS 6,043,427 A * 3/2000 Nishimoto .................. 136/258

FOREIGN PATENT DOCUMENTS

JP 08-097161 4/1996

OTHER PUBLICATIONS

English language translation of JP 08–097161 (Apr. 12, 1996).

* cited by examiner

Primary Examiner—Craig Thompson
(74) Attorney, Agent, or Firm—Fitzpatrick, Cella, Harper & Scinto

(57) ABSTRACT

A process for producing a semiconductor device such as a photovoltaic element including a solar cell or a photosensor having a photoelectric conversion semiconductor layer formed by sequentially forming a p-type or n-type semiconductor layer composed of a non-single crystalline silicon series semiconductor material, an i-type semiconductor layer composed of a non-single crystalline silicon series semiconductor material, and an n-type or p-type semiconductor layer composed of a non-single crystalline silicon series semiconductor material on a substrate by means of plasma CVD, characterized in that at least one i-type semiconductor as said i-type semiconductor layer is formed in a discharge chamber having a cathode electrode by means of VHF plasma CVD using a silicon-containing raw material gas, wherein a VHF power of a wattage which is two times or less that of a VHF power required for decomposing 100% of said silicon-containing raw material gas is applied to said cathode electrode.

11 Claims, 10 Drawing Sheets

F I G. 4
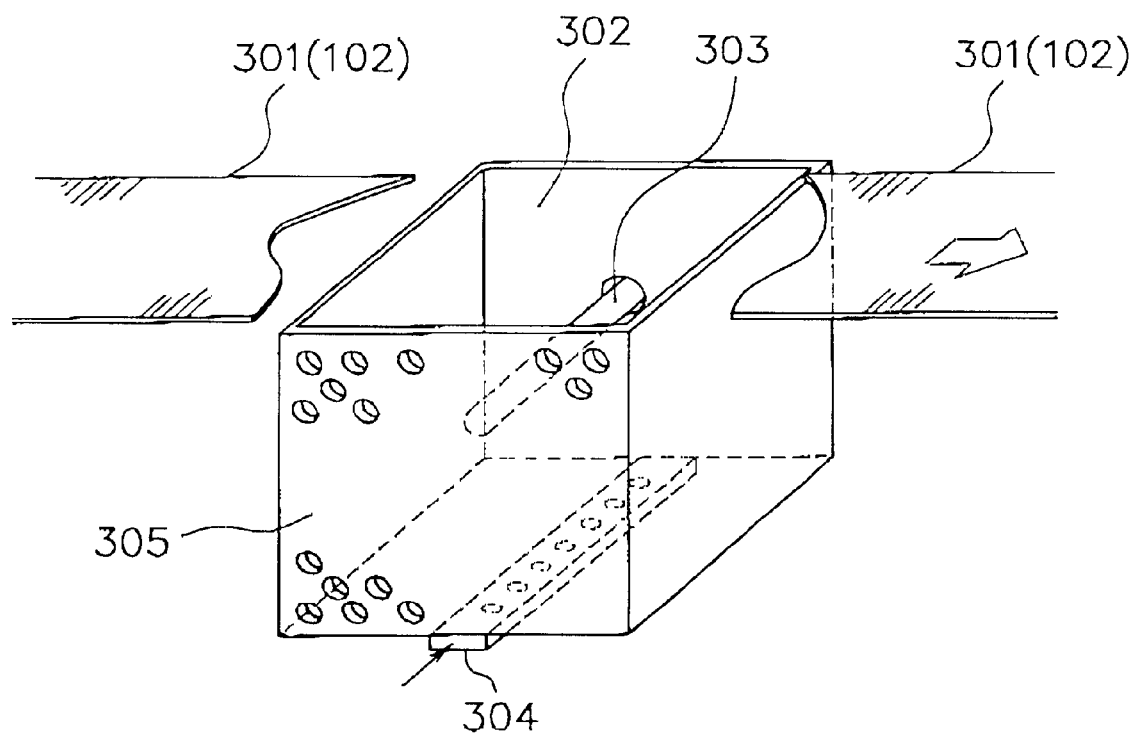

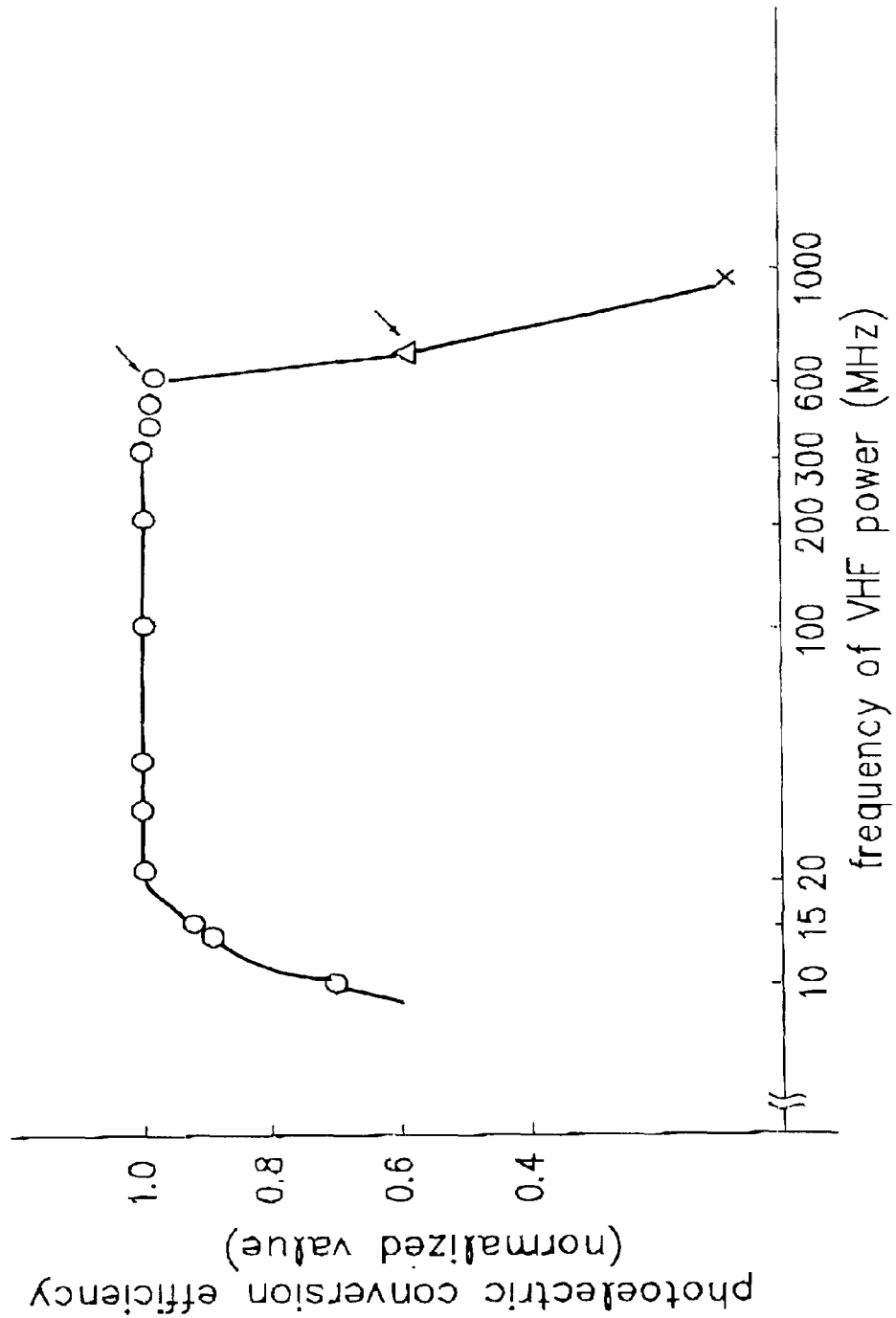

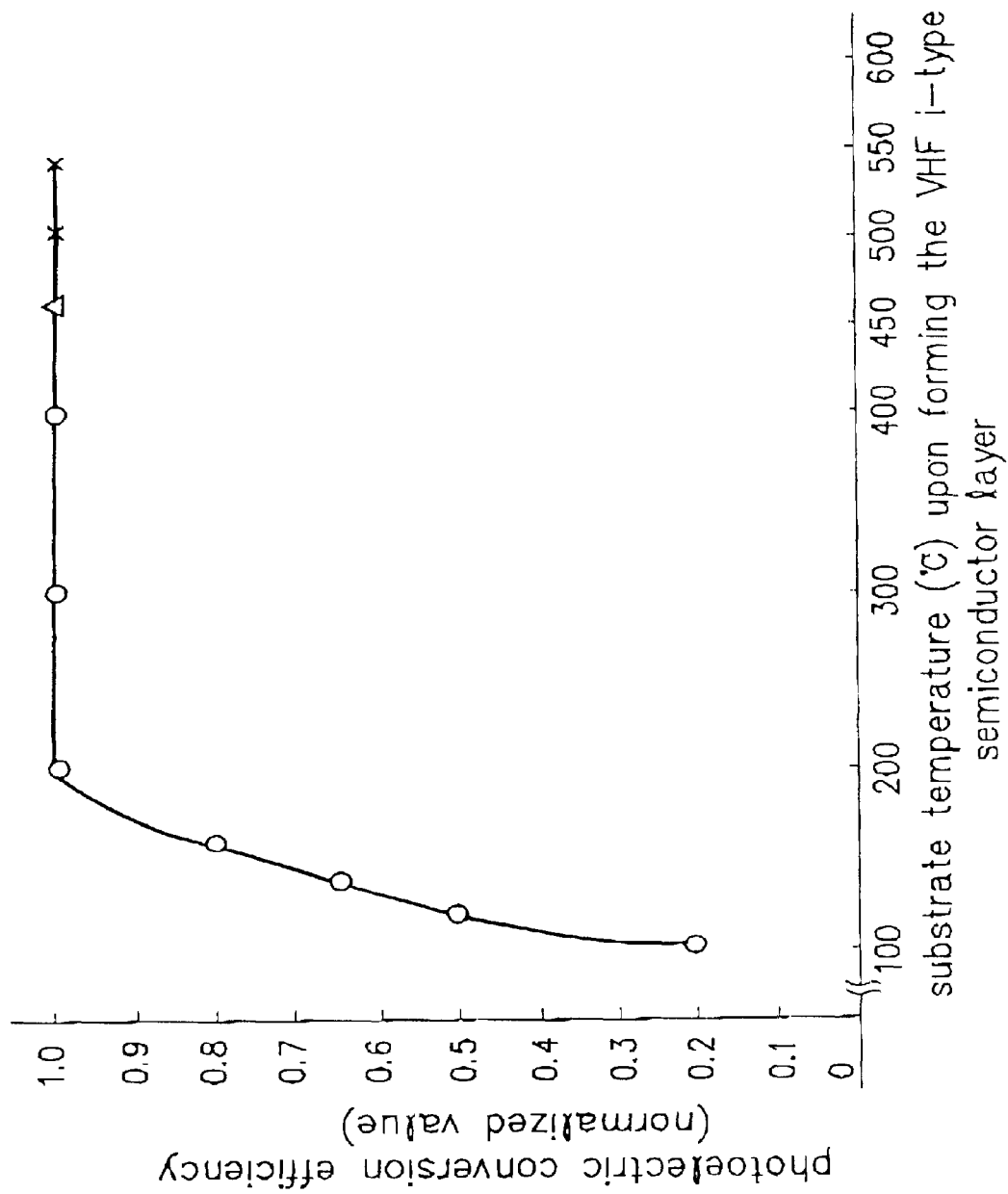

PROCESS FOR PRODUCING A SEMICONDUCTOR DEVICE

This is a continuation of application Ser. No. 09/645,036 filed Aug. 24, 2000, now abandoned.

BACKGROUND OF THE INVENTION

1. Field of the Invention

The present invention relates to a process for producing a semiconductor device such as a photovoltaic element including a solar cell, a photosensor, or the like.

2. Related Background Art

For the production of a solar cell which is categorized to a photovoltaic element, there are known various production processes. For instance, in the case of producing a solar cell having a photoelectric conversion semiconductor layer composed of a non-single crystalline semiconductor material (this solar cell will be hereinafter referred to as "non-single crystalline series solar cell"), a plasma CVD (chemical vapor deposition) process has been widely adopted on an industrial scale. The non-single crystalline semiconductor material herein is meant to include an amorphous semiconductor material, a microcrystalline semiconductor material, a polycrystalline semiconductor material, and the like.

For the non-single crystalline series solar cell to be used as a sunlight power generation source, it is basically required that the photoelectric conversion semiconductor layer has a large area, the solar cell has excellent and stable solar cell characteristics and it exhibits a high photoelectric conversion efficiency, and the solar cell can be mass-produced In order to produce such non-single crystalline series solar cell by means of a plasma CVD process so as to satisfy these requirements, it is necessary to have due consideration so that as the photoelectric conversion semiconductor layer, a large area homogeneous semiconductor film having a uniform thickness and which excels in electrical, optical and photoconductive characteristics, mechanical characteristics, fatigue resistance upon repeated use, and use environmental characteristics can be repeatedly formed at a high speed and with a good reproducibility.

Separately, there have been proposed a variety of sunlight power generation systems using solar cells having such configuration as above described. Such sunlight power generation system typically comprises a unit in which a plurality of solar cell modules [comprising a plurality of solar cells (photovoltaic elements) electrically serialized while being sealed by a sealing material] are electrically connected with each other in series connection or parallel connection so as to obtain a desired electric current and a desired voltage. In this case, it is important that neither disconnection nor short are not occurred in each solar cell module and that all the solar cell modules are uniform as much as possible with respect to their output voltage and output electric current For this purpose, at a stage of forming the respective solar cell modules, it is an important factor that the semiconductor layers used therein, which are an utmost decisive factor of dominating the characteristics of the solar cell module, are made to be uniform in terms of the characteristics. Besides, in viewpoints of making it easy to design a solar cell module and simplifying the fabrication process of a solar cell module, it is important to make it possible to efficiently form a homogeneous semiconductor film having a uniform property over a large area, where this situation leads to improving the productivity of a solar cell and diminishing the production cost thereof.

Incidentally, the semiconductor layer of a solar cell (a non-single crystalline series solar cell) has a semiconductor junction such as p-i-n (or n-i-p) junction, p-n (or n-p) junction or the like. For instance, in the case where the semiconductor layer comprises an amorphous silicon (a-Si) material and has a p-i-n junction structure, the p-i-n junction structure comprises, for example, an n-type a-Si semiconductor layer, an i-type a-Si semiconductor layer and an p-type a-Si semiconductor layer stacked in this order, where the n-type a-Si semiconductor layer may be formed by subjecting a gaseous mixture of a film-forming raw material gas such as silane ($SiH_4$ or the like) and an n-type dopant-supplying compound such as $PH_3$ to glow discharge decomposition, the i-type a-Si semiconductor layer may be formed by subjecting said film-forming raw material gas to glow discharge decomposition, and the p-type a-Si semiconductor layer may be formed by subjecting a gaseous mixture of said film-forming raw material gas and an p-type dopant-supplying compound such as $B_2H_6$ to glow discharge decomposition.

For the production of a non-single crystalline series solar cell having such semiconductor junction, there are known methods using a multi-chambered plasma CVD apparatus comprising a plurality of film-forming chambers communicated with each other, where a semiconductor layer having a desired conduction type is formed by each film-forming chamber to form a semiconductor layer having a stacked structure with a desired semiconductor junction. As a representative example of such plasma CVD apparatus, there can be mentioned a roll-to-roll type plasma CVD apparatus for continuously forming a deposited film on an elongated substrate as disclosed, for instance, in U.S. Pat. No. 4,400,409. The roll-to-roll type plasma CVD apparatus described in this document comprises a plurality of glow discharge regions (film-forming spaces in other words) provided in a plurality of processing chambers communicated with each other. In said document, there is described that semiconductor elements having a semiconductor junction can be continuously formed by continuously transporting an elongated flexible substrate having a desired width in the longitudinal direction along a route of sequentially passing through the glow discharge regions while forming a semiconductor layer of a desired conduction type on said substrate by each glow discharge region.

In this apparatus, each glow discharge region (that is, each film-forming space) is provided in the corresponding film-forming chamber whose inside can be maintained in a vacuumed state. In order to prevent film-forming raw material gas including doping gas (dopant-supplying gas) used for the formation of a deposited film as a semiconductor layer in each glow discharge region (film-forming space) from being diffused or contaminated into the glow discharge region situated next thereto, a gas gate is provided between each adjacent film-forming chambers. The gas gate comprises a slit-like separation passage through which adjacent film-forming chambers are communicated, where separation gas such as Ar gas, $H_2$ gas or the like is flown into the separation passage to form a gas flow of the separation gas whereby the adjacent film-forming chambers are isolated one from the other.

The film-forming method using the above-described roll-to-roll type plasma CVD apparatus is suitable for mass-producing functional deposited films or semiconductor devices such as photovoltaic elements including solar cells. However, there are such disadvantages as will be described below.

That is, because the space for forming a p-type or n-type semiconductor layer is substantially isolated from the space for forming an i-type semiconductor layer as above described, it is possible to prevent a dopant in the gaseous state used in the former space from being contaminated into the latter space.

However, for instance, at the time of forming an i-type semiconductor layer on a previously formed n-type semiconductor layer or after the i-type semiconductor layer is formed on the n-type semiconductor layer, there is an occasion in that for example phosphorous element (P) as the dopant in the n-type semiconductor layer is thermally diffused into the i-type semiconductor layer, where the n-i junction is weakened.

A solar cell whose photoelectric conversion semiconductor layer has a semiconductor junction including such weakened n-i junction has inferior initial characteristics such that the open-circuit voltage (Voc) and fill factor (F.F.) are insufficient and therefore, the initial photoelectric conversion efficiency is insufficient.

Besides, in the case of a solar cell having a photoelectric conversion layer with a p-i-n junction formed in accordance with the film-forming method using the foregoing roll-to-roll type plasma CVD apparatus, even when the solar cell has a satisfactory initial photoelectric conversion efficiency, it is liable to have such disadvantages as will be described in the following. That is, when the solar cell is continuously used under severe environmental conditions outdoors, there is a tendency in that the dopant in the p-type semiconductor layer or the n-type semiconductor layer is gradually thermally diffused into the i-type semiconductor layer to deteriorate the characteristics of the solar cell, where the photoelectric conversion efficiency of the solar cell is eventually deteriorated. Thus, the solar cell is insufficient in terms of the reliability.

As previously described, the film-forming method using the foregoing roll-to-roll type plasma CVD apparatus is suitable for mass-producing solar cells. However, there are still subjects to be improved in order to stably and efficiently mass-produce highly reliable solar cells having uniform solar cell characteristics and which exhibit a satisfactory photoelectric conversion efficiency which is hardly deteriorated even when continuously used under severe environmental conditions outdoors over a long period of time at a reasonable production cost.

Now, in the case where a plurality of solar cell modules [comprising a plurality of solar cells (photovoltaic elements) electrically serialized while being sealed by a sealing material] are electrically connected with each other in series connection or parallel connection into a unit, the solar cell module whose output electric current or output voltage is minimum becomes a rate-limiting factor to dominate the characteristics of the unit.

In this connection, it is very important to improve not only the average characteristics of all the solar cell modules involved but also variations among the solar cell modules in terms of the characteristics.

For this purpose, at a stage of forming the respective solar cell modules, it is necessary for the semiconductor layers used therein, which are an utmost decisive factor of dominating the characteristics of the solar cell module, to be made such that they are complete with respect to the characteristics. In addition, in order to reduce the production cost, it is also necessary to make the semiconductor layers have fewer defects so that neither disconnection nor short are occurred in the solar cell module, whereby the yield is improved.

In view of the above situation, there is an increased demand for improving the process for producing a photovoltaic element (a solar cell) by way of continuously forming a plurality of semiconductor layers on an elongated substrate (or a web substrate) which is continuously moving by means of plasma CVD, so that each of said plurality of semiconductor layers can be continuously and uniformly formed on the elongated substrate so as to have uniform characteristics and fewer defects over the entire of the elongated substrate.

SUMMARY OF THE INVENTION

The present invention has been accomplished in view of the foregoing technical subjects to be solved in the prior art.

An principal object of the present invention is to eliminate the foregoing problems in the prior art and to provide an improved process which enables one to efficiently produce a highly reliable semiconductor device having improved output characteristics.

The semiconductor device in the present invention includes a photovoltaic element including a solar cell, a photosensor, and the like.

Another object of the present invention is to provide a process for producing a highly reliable semiconductor device having a photoelectric conversion member and which has improved output characteristics at an improved yield, characterized in that a plurality of semiconductor layers to constitute said photoelectric conversion member are continuously formed so that each of said plurality of semiconductor layers has improved uniform characteristics and fewer defects.

A further object of the present invention is to provide a process for producing a highly reliable semiconductor device having a photoelectric conversion member formed by sequentially forming a p-type or n-type semiconductor layer composed of a non-single crystalline silicon series semiconductor material, an i-type semiconductor layer composed of a non-single crystalline silicon series semiconductor material, and an n-type or p-type semiconductor layer composed of a non-single crystalline silicon series semiconductor material by means of plasma CVD, characterized in that at least one i-type semiconductor layer as said i-type semiconductor layer is formed in a discharge chamber (or a film-forming chamber) by means of VHF (very high frequency) plasma CVD provided with a cathode electrode using a silicon atoms-containing raw material gas, wherein a VHF power of a wattage which is two times or less that of a VHF power required for decomposing 100% of said silicon atoms-containing raw material gas is applied to said cathode electrode.

BRIEF DESCRIPTION OF THE DRAWINGS

FIG. 4 is a schematic diagram illustrating the constitution of an example of the discharge chamber in the vacuum vessel in the film-forming apparatus shown in FIG. 3.

FIGS. 6 to 10 show respectively a graph of the results obtained in Example 1, 2, 3, 4, or 5 which will be later described.

DESCRIPTION OF THE INVENTION AND PREFERRED EMBODIMENTS

Figure 1:
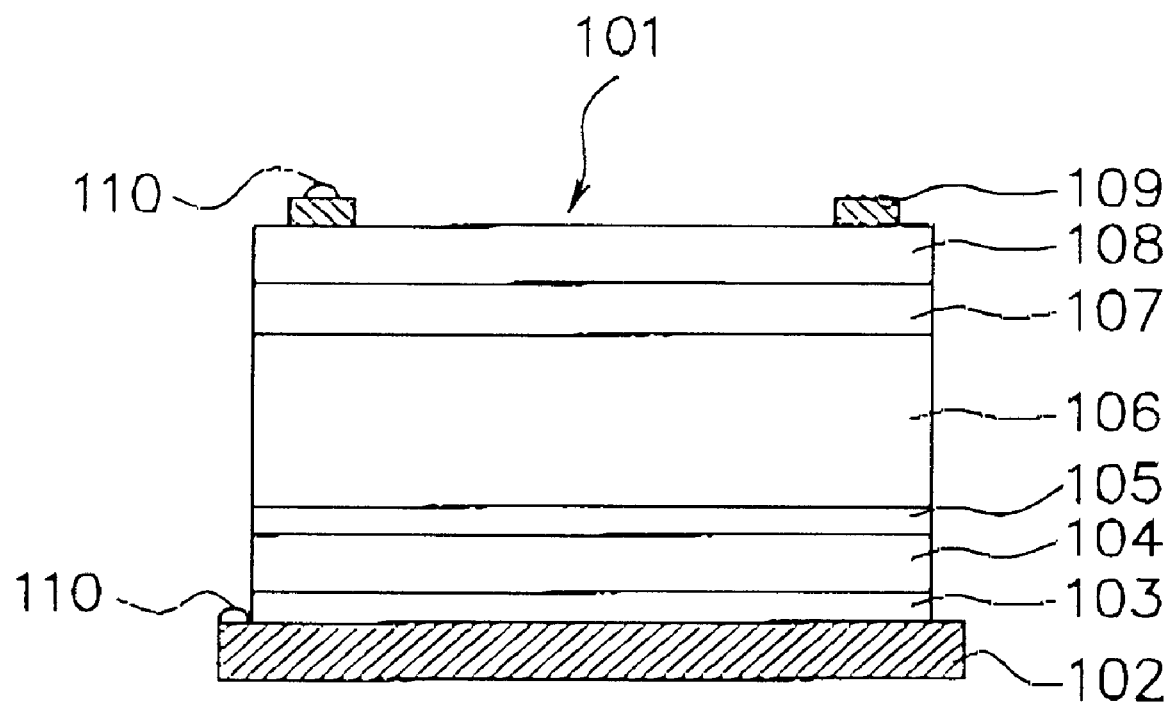
FIG. 1 is a schematic cross-sectional view illustrating the structure of an example of an photovoltaic element (a solar cell) produced in the present invention.

The present invention eliminates the foregoing problems found in the prior art and attain the above described objects.

The present invention typically provides a process for producing a highly reliable photovoltaic element having a photoelectric conversion semiconductor layer formed by sequentially forming a p-type or n-type semiconductor layer composed of a non-single crystalline silicon series semiconductor material, an i-type semiconductor layer composed of a non-single crystalline silicon series semiconductor material, and an n-type or p-type semiconductor layer composed of a non-single crystalline silicon series semiconductor material on a substrate by means of plasma CVD, characterized in that at least one i-type semiconductor as said i-type semiconductor layer is formed in a discharge chamber (a film-forming chamber) by means of VHF (very high frequency) plasma CVD provided with a cathode electrode using a silicon atoms-containing raw material gas, wherein a VHF power of a wattage which is two times or less that of a VHF power required for decomposing 100% of said silicon atoms-containing raw material gas is applied to said cathode electrode.

The VHF (very high frequency) used in the present invention is preferred to have a frequency (oscillation frequency) in a range of from 15 MHz to 500 MHz.

The substrate temperature in the formation of the i-type semiconductor layer is preferred to be in a range of from 200° C. to 450° C.

For the inner pressure of the discharge chamber upon forming the i-type semiconductor layer, in the case where the cathode electrode comprises a bar-like shaped electrode, it is preferred to be 300 mTorr or less. Similarly in the case where the cathode electrode comprises a plate electrode, it is preferred to be in a range of from 1 Torr to 10 Torr.

In the case where the cathode electrode comprises a plate electrode, the distance between the cathode electrode and the substrate is preferred to be in a range of from 5 mm to 30 mm.

In the present invention, prior to conducting the formation of the i-type semiconductor layer on the substrate by means of VHF plasma CVD, it is preferred to previously form an i-type semiconductor layer as a buffer layer by means of other appropriate film-forming process, preferably, an RF plasma CVD process.

In the present invention, it is preferred to adopt a method in which using a multi-chambered plasma CVD apparatus comprising a plurality of film-forming chambers (discharge chambers) each having a cathode electrode therein and which are communicated with each other, a web substrate (an elongated substrate) is continuously moved to sequentially pass through said plurality of film-forming chambers while forming a semiconductor layer of a desired conduction type on said web substrate by each film-forming chamber by means of plasma CVD, wherein the i-type semiconductor layer is formed by one of the film-forming chambers by means of VHF plasma CVD in the same manner as above described.

In the present invention, by applying a VHF power of a wattage which is two times or less that of a VHF power required for decomposing 100% of the silicon atoms-containing raw material gas, it is possible to restrain the activity of hydrogen atoms (H) generated when the raw material gas is decomposed by plasma produced in the glow discharge. In this connection, upon forming the i-type semiconductor layer by means of VHF plasma CVD, damage due to said hydrogen atoms can be lessened, where the i-type semiconductor layer formed becomes to be of high quality with fewer defects.

Further in the present invention, upon forming at least one i-type semiconductor layer by means of VHF plasma CVD, by applying a VHF power of a prescribed wattage to the cathode electrode comprising a bar-like shaped electrode in the discharge chamber and controlling the inner pressure of the discharge chamber to a pressure of preferably 300 mTorr or less, polymerization reaction in a vapor phase under condition with a relatively high deposition rate is restrained to prevent occurrence of a powdery material which is considered to be a cause of deteriorating characteristics of a photovoltaic element.

For the lower limit for the wattage of the VHF power applied upon the formation of the i-type semiconductor layer, it is necessary to be such a value that stable discharge can be generated and maintained. Specifically, taking the utilization efficiency of the silicon atoms-containing raw material gas into consideration, it is preferred to apply the VHF power of a wattage which is at least 0.5 time that of a VHF power required for decomposing 100% of the silicon atoms-containing raw material gas. In a more preferred embodiment, the lower limit for the wattage of the VHF power applied is a wattage which is corresponding to 1 time or more that of a VHF power required for decomposing 100% of the silicon atoms-containing raw material gas. In this case, the raw material gas utilization efficiency of 100% can be attained.

As previously, in the present invention, on the substrate on which the i-type semiconductor layer is to be formed by means of VHF plasma CVD, it is possible to previously form a buffer layer comprising an i-type layer by other appropriate film-forming process such as RF-plasma CVD process. In this case, the surface state of the substrate which is exposed to a VHF plasma atmosphere in the discharge chamber upon forming the i-type semiconductor layer by means of VHF plasma CVD can be made to be approximate to an i-type semiconductor layer formed by means of VHF plasma CVD. This situation makes the i-type semiconductor layer formed by means of VHF plasma CVD on the buffer layer to have a homogeneous film property. Thus, the i-type semiconductor layer formed by means of VHF plasma CVD to have uniform characteristics for the entire layer region of the i-type semiconductor layer. This situation makes it possible to form a high performance photovoltaic element which excels in output characteristics, particularly, in open-circuit voltage (Voc) and fill factor (F.F.), and which exhibits an improved photoelectric conversion efficiency.

Further, in the present invention, the formation of the i-type semiconductor layer on the substrate by means of VHF plasma CVD is conducted at a relatively high deposition rate. In this case, there will be a fear that peeling of the semiconductor layer would be occurred by virtue of distortion due to internal stress of the semiconductor layer to result in a decrease in the durability. Such fear can be eliminated by previously forming a buffer layer comprising an i-type semiconductor layer on the substrate by an appropriate film-forming process such as an RF plasma CVD process which is different from the VHF plasma CVD process prior to forming the i-type semiconductor layer by means of VHF plasma CVD, where the membrane stress is relaxed. Further, by conducting the formation of the i-type semiconductor layer as the buffer layer at a relatively low deposition rate by means of RF plasma CVD, it is possible to prevent dispersion of the dopant at the n/i or p/i interface in a practical use state. This situation makes it possible to produce a highly reliable photovoltaic element which excels in output characteristics and also in durability.

Further, as previously described, in the process for producing a photovoltaic element according to the present invention. It is possible to adopt a method in which using a multi-chambered plasma CVD apparatus comprising a plurality of film-forming chambers (discharge chambers) each having a cathode electrode therein and which are communicated with each other, a web substrate (an elongated substrate) is continuously moved to sequentially pass through said plurality of film-forming chambers while forming a semiconductor layer of a desired conduction type on said web substrate by each film-forming chamber by means of plasma CVD, wherein the i-type semiconductor layer is formed by one of the film-forming chambers by means of VHF plasma CVD in the same manner as above described. By this, it is possible to mass-produce highly reliable photovoltaic elements.

In the following, the present invention will be described in more detail with reference to the drawings.

Description will be made by exemplifying a solar cell as a photovoltaic element produced in the present invention.

FIG. 1 is a schematic cross-sectional view illustrating the structure of an example of a solar cell produced in the present invention.

In FIG. 1, reference numeral 101 indicates the entirety of a solar cell. The solar cell 101 comprises a substrate 102, a back reflection layer 103, an n-type semiconductor layer 104, an i-type semiconductor layer 105 (as a buffer layer) formed by means of RF plasma CVD (this i-type semiconductor layer will be hereinafter referred to as "RF i-type semiconductor layer"), an i-type semiconductor layer 106 formed by means of VHF plasma CVD (this i-type semiconductor layer will be hereinafter referred to as "VHF i-type semiconductor layer"), a p-type semiconductor layer 107, a transparent electrode layer 108, and a collecting electrode layer 109. The solar cell 101 has a pair of output electrodes 110, one fixed to the substrate 102 and the other fixed to the collecting electrode 109. The RF i-type semiconductor layer 105 is not always necessary to be provided. The stacked structure comprising at least the n-type semiconductor layer 104, the VHF i-type semiconductor layer 106 and the p-type semiconductor layer 107 functions as a photoelectric conversion semiconductor layer.

The solar cell 101 shown in FIG. 1 is of the type in that light is impinged through the side opposite the substrate. Depending upon the situation, it is possible to modify the solar cell so that light is impinged through the substrate side.

In the following, description will be made of each constituent of the solar cell.

Substrate

The substrate 102 serves not long as a substrate for the solar cell (photovoltaic element) but also as a lower electrode. The substrate 102 may take an appropriate configuration such as a plate-like shape, a sheet-like shape, or an elongated belt-like shape such as a web-like shape, respectively having an electrically conductive surface. In any case, it is desired for the substrate to be constituted by an appropriate material which is difficult to be deformed or distorted at a temperature in the formation of the semiconductor layer and has a sufficient physical strength.

Specifically, the substrate may comprise a metal selected from a group consisting of Al, Fe, and Cu; an alloy selected from a group consisting of alloys of these metals such as stainless steels; or a material selected from a group consisting of composites of these alloys.

Besides, the material by which the substrate is constituted can include thin plates made of said metals or said alloys having a surface coated by a metal thin film made of a different metal or/and an electrically insulative thin film of $SiO_2$, $Si_3N_4$, $Al_2O_3$, or $AlN_3$ by way of sputtering, vacuum deposition, or plating.

Alternatively, the substrate may comprise a heat-resistant resin sheet made of a heat-resistant synthetic resin such as polyimide, polyamide, polyethylene terephthalate, or epoxy resin, having a surface applied with electrically conductive treatment using a metal, an alloy or a transparent electrically conductive oxide (TCO) by means of plating, vacuum evaporation, sputtering, or coating. Besides, the substrate may comprise a composite comprising said heat-resistant resin sheet and a glass fiber, a carbon fiber, or a metallic fiber, having a surface applied with electrically conductive treatment using a metal, an alloy or a transparent electrically conductive oxide (TCO) by means of plating, vacuum evaporation, sputtering, or coating.

In the case of using a web-like shaped substrate (that is, a web substrate) as the substrate 102, the thickness thereof is desired to be as thinner as possible in view of the cost benefit and the storage space as long as it can maintain an adequate strength upon transporting in the fabrication apparatus for producing a solar cell. Specifically, the web substrate is desired to have a thickness preferably in a range of from 0.01 mm to 5 mm, more preferably in a range of from 0.02 mm to 2 mm, most preferably in a range of from 0.05 mm to 1 mm. In the case where the web substrate comprises an elongated thin plate made or a metal or the like, even when the thickness thereof is relatively thinned, a prescribed strength can be readily achieved.

There is no particular limitation for the width of the web substrate. The width should be determined depending upon the size of a semiconductor layer-forming means, that of a vessel for it, and the like. There is also no particular limitation for the length of the web substrate. The web substrate may be of a length which can be wound in a roll form. The web substrate may comprise an elongated belt-like substrate connected to another elongated belt-like substrate by means of welding or the like.

The web substrate may have a smooth surface or an irregular surface comprising a number of minute irregularities. Such irregular surface may comprise a number of spherical, conic, or pyramid-like irregularities with an average peak-to-valley elevation in a rage of from 50 nm to 500 nm. In this case, reflection of light at such irregular surface becomes irregular reflection to prolong the optical path of reflected light.

Electrode

The electrode is meant to include the back reflection layer 103, the transparent electrode layer 108, and the collecting electrode 109, respectively provided when required, depending upon the configuration of a solar cell.

In this embodiment, the transparent electrode layer 108 is provided on the light incident side. The back reflection layer 103 is provided to oppose the transparent electrode layer 108 through the photoelectric conversion semiconductor layer, where the back reflection layer 103 functions as a lower electrode.

Back Reflection Layer 103:

The back reflection layer 103 is arranged on the back side of the photoelectric conversion semiconductor layer with respect to the direction for light to be impinged. The back reflection layer serves to reflect light not having absorbed by the photoelectric conversion semiconductor layer and reached the substrate into the photoelectric conversion semiconductor layer so that it is recycled in the photoelectric conversion semiconductor layer.

The back reflection layer 103 comprises a metallic layer constituted by an appropriate metallic material such as a metal or alloy. Specific examples of said metal are Ag, Au, Pt, Ni, Cr, Al, Ti, Zn, Mo, and W. Specific examples of said alloy are alloys of said metals such as stainless steels. The back reflection layer 103 may comprise a multi-layered structure comprising two or more layers each comprising a different material stacked.

The back reflection layer may be designed to have an even surface or an uneven surface.

The back reflection layer comprising any of the foregoing materials may be formed by means of vacuum deposition, electron beam evaporation, sputtering, or the like. For the metallic layer formed as the back reflection layer, consideration is necessary to be made so that it does not become to be a resistance component against an output power of the solar cell 101. In view of this, the metallic layer as the back reflection layer is desired to have a sheet resistance of preferably less than 50 Ω, more preferably less than 10 Ω.

Transparent Electrically Conductive Layer (not shown in the figure):

On the surface of the back reflection layer 103, namely between the back reflection layer 103 and the n-type semiconductor layer 104, it is possible to provide a transparent electrically conductive layer (not shown) comprising an appropriate transparent electrically conductive material in order to prevent occurrence of short circuit between the back reflection layer 103 and the transparent electrode layer 108 and also in order to prevent the constituent of the metallic layer as the back reflection layer from diffusing into the semiconductor layer (the n-type semiconductor layer 104) situated above the back reflection layer. Particularly, by making the transparent electrically conductive layer to have an adequate electric resistance, the back reflection layer 103 and the transparent electrode layer 108 can be effectively prevented from being short-circuited due to defects such as pinholes present in the photoelectric conversion semiconductor layer. In addition, the transparent electrically conductive layer functions to increase irregular reflection of not only incident light but also reflected light into the photoelectric conversion semiconductor layer whereby prolonging the optical path length in the photoelectric conversion semiconductor layer.

The transparent electrically conductive layer is required to have a sufficient transmittance for light having a wavelength which is capable of being absorbed by the semiconductor layer involved, and it is desired to have an adequate electric resistance.

The transparent electrically conductive material to constitute the transparent electrically conductive layer can include inorganic oxides such as $SnO_2$, $In_2O_2$, ITO ($In_2O_2$+$SnO_2$), ZnO, CdO, $Cd_2SnO_4$, and mixtures of these.

The transparent electrically conductive layer constituted by any of the above-mentioned materials may be formed by means of vacuum deposition, electron beam evaporation, sputtering, or coating.

The transparent electrically conductive layer may be designed to have an even surface or an uneven surface.

Transparent Electrode Layer 108:

The transparent electrode layer 108 is provided on the p-type semiconductor layer 107 and it functions as an upper electrode having a property of transmitting light on the light incident side. When the thickness of the transparent electrode layer is adequately adjusted, it also functions as a reflection preventive layer.

The transparent electrode layer is required to have a sufficient transmittance for light having a wavelength which is capable of being absorbed by the semiconductor layer involved and a sufficiently low electric resistance. For the transmittance, it is preferably 70% or more or more preferably, 80% or more, for light from the sun, a white fluorescent lamp or the like.

The transparent electrode layer is constituted by an electrically conductive material selected from a group consisting of inorganic oxides such as $SnO_2$, $In_2O_3$, ITO ($In_2O_3$+$SnO_2$), ZnO, CdO, $Cd_2SnO_4$, and mixtures of these. Alternatively, the transparent electrode layer may comprise an extremely thin translucent metallic film formed of an metal such as Au, Al, or Cu.

The transparent electrode layer 108 constituted by any of the above-mentioned materials may be formed by means of resistance-heating evaporation, sputtering, or coating.

Collecting Electrode 109:

The collecting electrode 109 is not always necessary to be provided. The collecting electrode 109 is disposed on a part of the surface of the transparent electrode layer 108 mainly for the purpose of decreasing the sheet resistance of the transparent electrode layer 108.

In the production of a solar cell having the configuration shown in FIG. 1, the transparent electrode layer 108 is formed after the formation of the photoelectric conversion semiconductor layer, and because of this, it is difficult to excessively heighten the substrate temperature upon the formation of the transparent electrode layer 108. In this connection, the transparent electrode layer 108 formed unavoidably becomes to have a relatively high sheet resistance. Therefore, it is preferred to provide the collecting electrode 109.

The collecting electrode 109 may comprise a metal selected from a group consisting of Ag, Cu, Ni, Al, Au, Ti, Pt, Cu, Mo, and W; an alloy selected from a group consisting of alloys of these metals; or an electrically conductive paste comprising a metallic powder of any of these metals and alloys or a carbon powder.

In the case of using said metal or alloy may be formed, a desired pattern as the collecting electrode may be formed by means of vacuum evaporation, sputtering or plating using a patterning mask.

And in the case of using said electrically conductive paste, a desired pattern as the collecting electrode may be formed by means of screen printing using a patterning mask.

The collecting electrode 109 is desired to be formed in a form which is uniformly spread over the entire light receiving face of the solar cell 101 so as to secure a sufficient quantity for light to be impinged into the photoelectric conversion semiconductor layer.

The proportion of the area occupied by the collecting electrode to the entire light-receiving surface area of the solar cell is desired to be preferably less than 15%, more preferably less than 10%.

And for the sheet resistance of the collecting electrode, it is preferably less than 50 Ω, more preferably less than 10 Ω.

Photoelectric Conversion Semiconductor Layer

The photoelectric conversion semiconductor layer comprises at least the n-type semiconductor layer 104, the VHF i-type semiconductor layer 106 and the p-type semiconductor layer 107. In the case where the RF i-type semiconductor layer 105 as the buffer layer, the RF i-type semiconductor layer 105 is included in the photoelectric conversion semiconductor layer.

The VHF i-type semiconductor layer 106 may comprise a group IV series non-single crystalline semiconductor material or a group IV alloy series non-single crystalline semiconductor material. Such non-single crystalline semiconductor material can include amorphous silicon (a-si) series materials such as a-Si:H, a-Si:F, a-Si:H:F, a-SiC:H, a-SiC:F, a-SiC:H:F, a-SiGe:H, a-SiGe:F, a-SiGe:H:F, and the like; polycrystalline silicon (poly-Si) series materials such as poly-Si:H, poly-Si:F, poly-Si:H:F, and the like; and microcrystalline silicon ($\mu$c-Si) series materials such as $\mu$c-Si:H, $\mu$c-Si:F, $\mu$c-Si:H:F, and the like.

Such non-single crystalline semiconductor material to constitute the VHF i-type semiconductor layer 106 is desired to contain hydrogen atoms or/and halogen atoms in an amount of preferably 20 atomic % or less, or more preferably 10 atomic % or less.

Each of the n-type semiconductor layer 104 and the p-type semiconductor layer 107 may comprise any of the above-mentioned non-single crystalline semiconductor materials to constitute the VHF i-type semiconductor layer 106, which are doped with an n-type valence electron controlling agent or a p-type valence electron controlling agent. The n-type valence electron controlling agent can include elements of group V of the periodic table such as P, As, Sb, and Bi. The p-type valence electron controlling agent can include element of group III of the periodic table such as B, Al, Ga, In, and Tl.

As the non-single crystalline semiconductor material to constitute the n-type semiconductor layer 104 or the p-type semiconductor layer 107, it is desired to use a non-single crystalline semiconductor material selected from those non-single crystalline semiconductor materials mentioned in the above, which contains crystalline phases, in order to improve the utilization efficiency of light and the photocarrier density.

As well as in the case of the VHF i-type semiconductor layer 106, the non-single crystalline semiconductor material to constitute the n-type semiconductor layer 104 or the p-type semiconductor layer 107 is desired to contain hydrogen atoms or/and halogen atoms in an amount of preferably 20 atomic % or less, or more preferably 10 atomic % or less.

A semiconductor layer as the VHF i-type semiconductor layer 106, the n-type semiconductor layer 104 or the p-type semiconductor layer 107 comprising a given group IV series non-single crystalline semiconductor material or a given group IV alloy series non-single crystalline semiconductor material may be formed by introducing an appropriate gaseous raw material into a discharge space (or a film-forming space) for the formation of the VHF i-type semiconductor layer 106, the n-type semiconductor layer 104 or the p-type semiconductor layer 107. Such appropriate gaseous raw material can include gaseous or easily gasifiable silicon-containing compounds, gaseous or easily gasifiable germanium-containing compounds, gaseous or easily gasifiable carbon-containing compounds, and mixtures of these compounds.

The gaseous or easily gasifiable silicon-containing compound can include chain silane compounds and cyclic silane compounds. Specific examples of such compound are $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, and $Si_2Cl_3F_3$ which are gaseous or easily gasifiable.

Specific examples of the gaseous or easily gasifiable germanium-containing compound are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Specific examples of the gaseous or easily gasifiable carbon-containing compound are $CH_4$, $CD_4$, $C_nH_{2n+2}$ (with n being an integer), $C_nH_{2n}$ (with n being an integer), $C_2H_2$, $C_6H_6$, $CO_2$, and CO.

The starting material for the introduction of the group III element as the p-type valence electron controlling agent can include boron hydrates such as $B_2H_6$, $B_4H_{10}$, $B_5H_9$, $B_5H_{11}$, $B_6H_{10}$, $B_6H_{12}$, and $B_6H_{14}$, and boron halides such as $BF_3$, and $BCl_3$. Besides, $AlCl_3$, $GaCl_3$, $InCl_3$ and $TlCl_3$ are also usable. Of these, $B_2H_6$ and $BF_3$ are particularly suitable.

The starting material for the introduction of the group V element as the n-type valence electron controlling agent can include phosphorous hydrides such as $PH_3$, and $P_2H_4$, and phosphorous halides such as $PH_4I$, $PF_3$, $PF_5$, $PCl_3$, $PCl_5$, $PBr_3$, and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable. Of these, $PH_3$ and $PF_3$ are particularly suitable.

Any of the foregoing compounds may be introduced into the discharge space while being mixed with an inert gas such as He gas, Ne gas, Ar gas, Kr gas, Xe gas, or Rn gas, or a dilution gas such as $H_2$ gas, HF gas, or HCl gas.

The RF i-type semiconductor layer 105 is desired to comprise an amorphous silicon (a-Si) series semiconductor material. Such a-Si series semiconductor material can include a-Si:H, a-Si:F, a-Si:H:F, a-SiC:H, a-SiC:F, a-SiC:H:F, a-SiGe:H, a-SiGe:F, a-SiGe:H:F, and the like.

The RF i-type semiconductor layer 105 is desired to have a physical property which is quite similar to or substantially the same as that of the VHF i-type semiconductor layer 106 which is formed on the RF i-type semiconductor layer 105. Specifically, it is desired for the RF i-type semiconductor layer 105 and the VHF i-type semiconductor layer 106 to be made such that they are substantially the same at least in terms of the optical band gap and optical absorption coefficient and they are close proximate in terms of the electric conductivity and Fermi level. This circumstance is similar also for the interface between the RF i-type semiconductor layer 105 and the n-type semiconductor layer 104 situated under the RF i-type semiconductor layer 105. That is, it is desired for the RF i-type semiconductor layer 105 and the n-type semiconductor layer 104 to be made such that they are substantially the same at least in terms of the optical band gap and optical absorption coefficient and they are close proximate in terms of the electric conductivity and Fermi level. In this case, structural disorder or stress which will be occurred in the interface between the two semiconductor layers can be relaxed to improve the consistency in said interface. This situation makes a solar cell produced to have an improved reliability.

In more detail, the RF i-type semiconductor layer 105 is provided at the n/i interface, i.e., the interface between the n-type semiconductor layer 104 and the VHF i-type semiconductor layer 106, where the RF i-type semiconductor layer 105 functions as the buffer layer to prevent the characteristics of the n/i junction from being deteriorated due to distortion at the time of joining the VHF i-type semiconductor layer 106 with the n-type semiconductor layer 104 because of a difference between the internal stress of the n-type semiconductor layer 104 and that of the VHF i-type semiconductor layer 106 and to improve the adhesion between the VHF i-type semiconductor layer 106 and the n-type semiconductor layer 104 so as to prevent occurrence of peeling between the two semiconductor layers. Because of this, the n/i junction becomes to have a improved strength against bending force or impact force. This situation makes a solar cell produced to have an improved reliability.

Formation of Semiconductor Layer

Description will be made of a method of forming a VHF i-type semiconductor layer 106 and an RF i-type semiconductor layer 105.

Formation of VHF I-type Semiconductor Layer 106:

In the formation of the VHF i-type semiconductor layer 106 in the discharge chamber (or the film-forming chamber) for the formation of the VHF i-type semiconductor layer, the inner pressure of the discharge chamber is preferably 500 mTorr or less, more preferably 400 mTorr or less. In the case where the formation of the VHF i-type semiconductor layer is conducted at a deposition rate of 20 Å/second, the inner pressure is made to be 300 mTorr or less. In the case where a given gaseous raw material is introduced into the discharge chamber, where a VHF power of a prescribed wattage is applied to cause VHF plasma discharge, whereby decomposing the gaseous raw material to form a deposited i-type semiconductor film as the VHF i-type semiconductor layer 106 on the substrate 102 at such high deposition rate, the temperature of the substrate 102 is made to be preferably in a range of from 200 to 450° C., more preferably in a range of from 200 to 400° C. in view of more relaxing the stress of the deposited semiconductor film formed. For the VHF power upon maintaining the VHF plasma discharge in this case, it is preferred to have a frequency selected in a range of from a frequency exceeding 13.56 MHz to 500 MHz. In the case where the deposition rate exceeds 20 Å/second or in the case where the RF i-type semiconductor layer 105 is formed prior to forming the VHF i-type semiconductor layer 106, the frequency of the VHF power is preferred to be in a range of from 20 MHz to 450 MHz.

For the wattage of the VHF power upon forming the VHF i-type semiconductor layer 106, it is made to be preferably 2 times or less or more preferably, 1.5 times or less that of a VHF power required for decomposing 100% of the gaseous raw material.

Formation of RF I-type Semiconductor Layer 105:

In the formation of a deposited i-type semiconductor film as the RF i-type semiconductor layer 105 in the discharge chamber for the formation of the RF i-type semiconductor layer, the deposition rate is preferably in a range of from 0.05 to 30 Å/second particularly in view of making the deposited semiconductor film formed to have a desired property. Also in viewpoints of the productivity and the adhesion, the deposition rate is preferably in a range of from 0.1 to 20 Å/second. For the inner pressure of the discharge chamber upon forming the RF i-type semiconductor layer 105, it is preferably 100 mTorr or more, or more preferably, 200 mTorr or more.

In the case where the deposition rate is 30 Å/second or less, the inner pressure is preferred to be 300 mTorr or more. In the case where a given gaseous raw material is introduced into the discharge chamber for the formation of the RF i-type semiconductor layer 105, where an RF power of a desired wattage is applied to cause RF plasma discharge, whereby decomposing the gaseous raw material to form a deposited i-type semiconductor film as the RF i-type semiconductor layer 105 on the substrate 102 at such high deposition rate, the temperature of the substrate 102 is preferred to be made such that it falls in a range of from 150 to 450° C. and is in close proximity to the substrate temperature upon forming the VHF i-type semiconductor layer 106.

Figure 2:
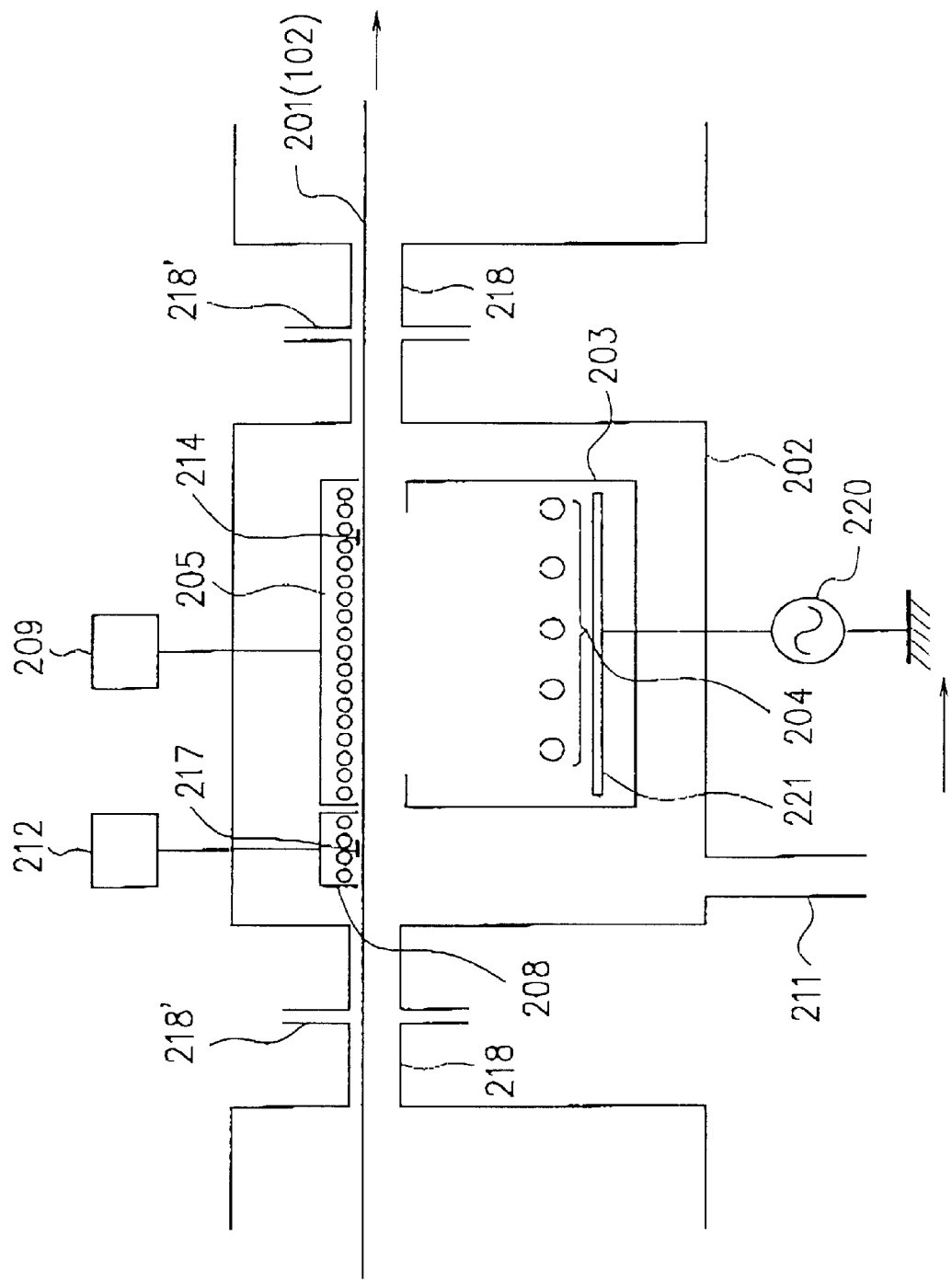
FIG. 2 is a schematic diagram illustrating the constitution of a principal part of an example of a film-forming apparatus having a vacuum vessel having a discharge chamber (or a film-forming chamber) provided therein used the present invention.
Figure 3:
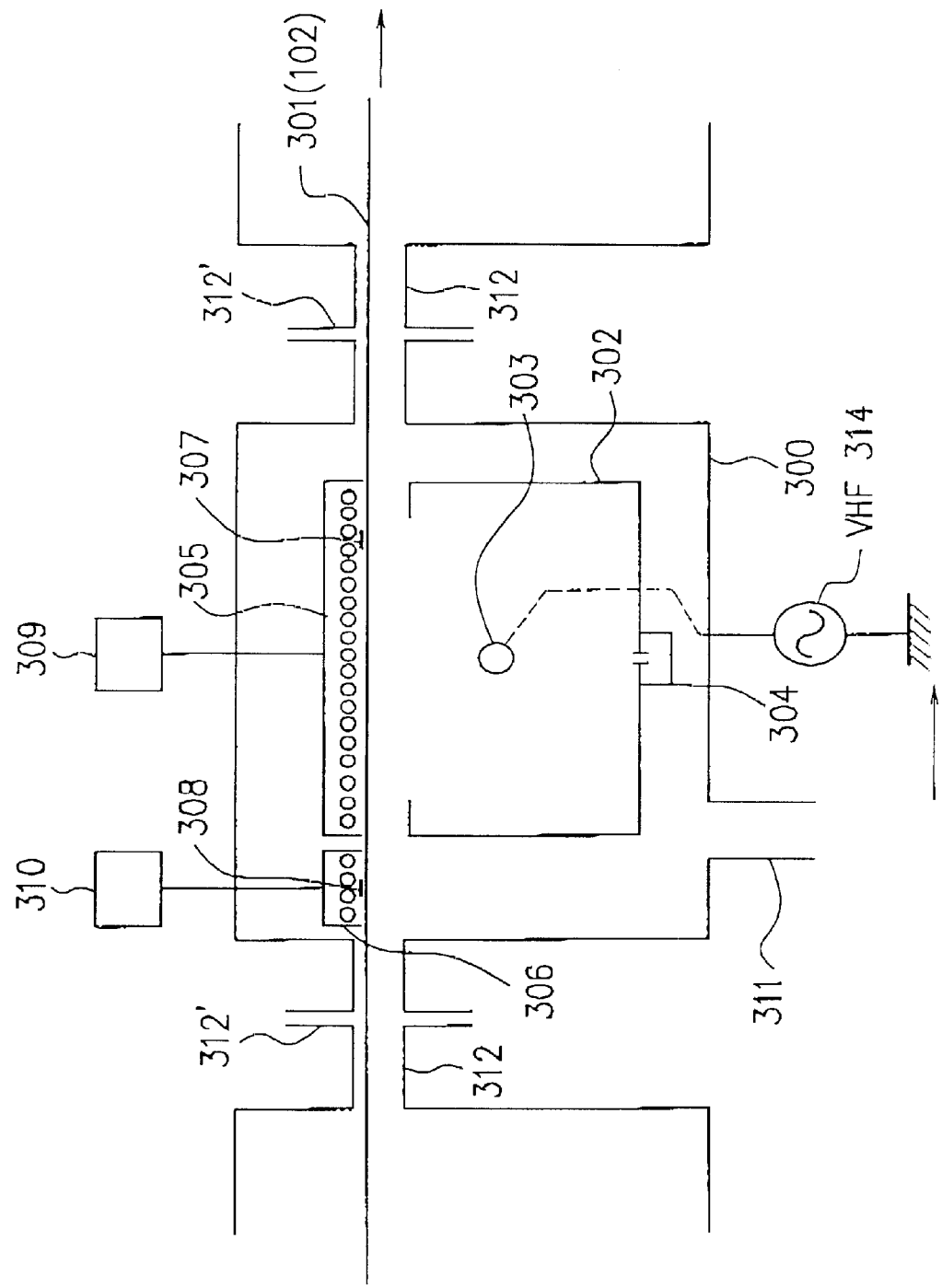
FIG. 3 is a schematic diagram illustrating the constitution of a principal part of another example of a film-forming apparatus having a vacuum vessel having a discharge chamber (or a film-forming chamber) provided therein used in the present invention.
Figure 5:
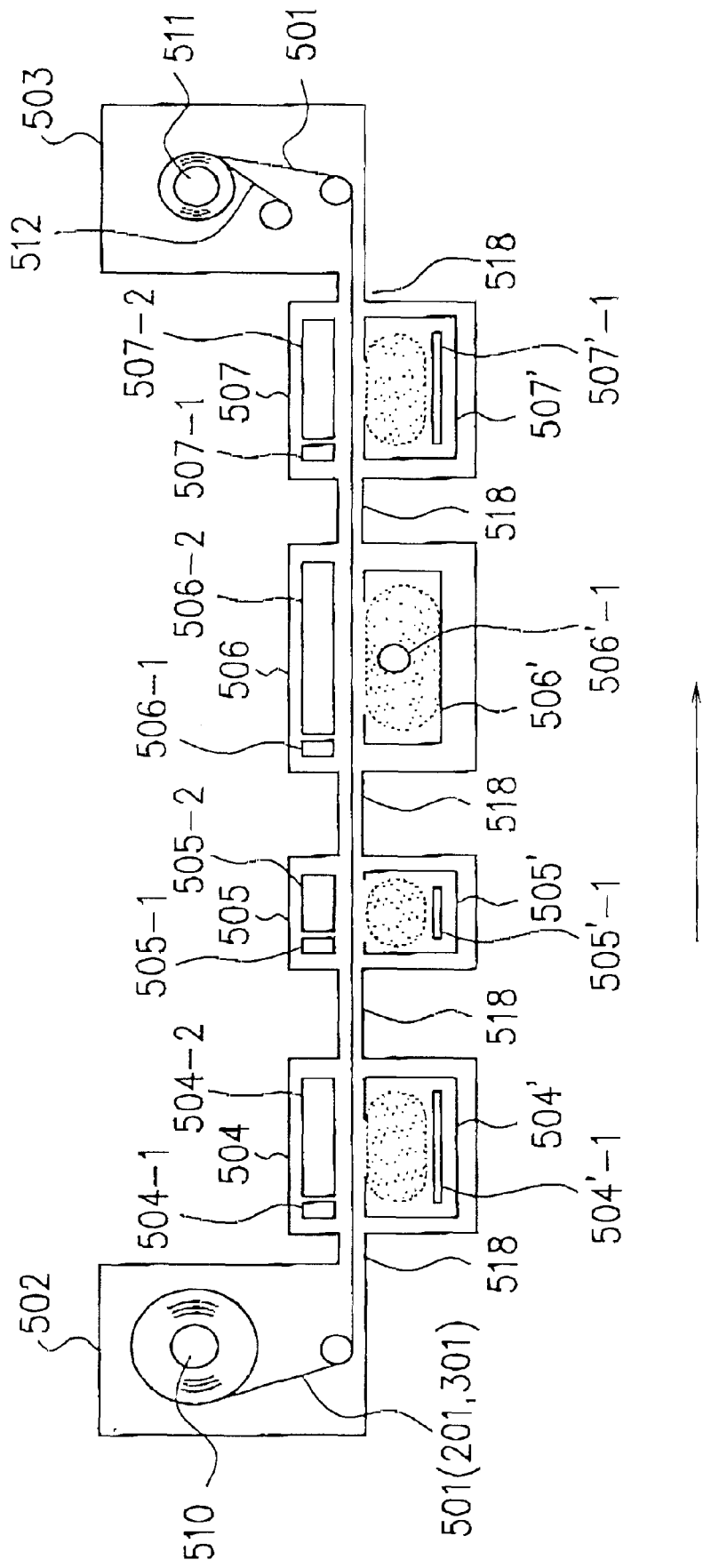
FIG. 5 is a schematic diagram illustrating the constitution of an example of a roll-to-roll type continuous film-forming apparatus used in the present invention.

In the following, description will be made of an example of a fabrication apparatus suitable for producing a solar cell in the present invention with reference to FIGS. 2 to 5. FIGS. 2 to 4 are schematic diagrams respectively illustrating the constitution of a principal part of a continuous film-forming apparatus adopted for producing a solar cell in the present invention. Particularly, FIG. 2 is a schematic diagram illustrating the constitution of an example of a film-forming vacuum vessel having a discharge chamber provided therein for the formation of an n-type semiconductor layer, a p-type semiconductor layer or an RF i-type semiconductor layer by means of RF plasma CVD, which is provided in a continuous film-forming apparatus adopted for producing a solar cell in the present invention. FIG. 3 is a schematic diagram illustrating the constitution of an example of a film-forming vacuum vessel having a discharge chamber provided therein for the formation of a VHF i-type semiconductor layer by means of VHF plasma CVD, which is provided in said continuous film-forming apparatus. FIG. 4 is a schematic diagram illustrating the constitution of an example of the discharge chamber provided in the film-forming vacuum vessel shown in FIG. 3. FIG. 5 is a schematic diagram illustrating the constitution of an example of a roll-to-roll type continuous film-forming apparatus as an example of said continuous film-forming apparatus in which such film-forming vacuum vessel having a discharge chamber by means of RF plasma CVD as shown in FIG. 3 and such film-forming vacuum vessel having a discharge chamber by means of VHF plasma CVD as shown in FIGS. 3 and 4 are provided.

Description will be made of FIG. 2. In FIG. 2, reference numeral 201 indicates a web substrate (corresponding to the substrate 101 in FIG. 1) which is transported in a direction shown by an arrow mark in the figure. Reference numeral 202 indicates a film-forming vacuum vessel having a discharge chamber 203 in a substantially rectangular form which is upward opened as shown in FIG. 2, where the web substrate 201 which is moving serves as an upper wall of the discharge chamber 203 to enclose the discharge chamber 203 such that an enclosed discharge space is formed between the discharge chamber 203 and the web substrate 201. A film is deposited on a surface of the web substrate 201 which is exposed to the discharge space. The film-forming vacuum vessel 202 and the discharge chamber 203 are respectively made of a metal material and they are electrically connected with each other. Incidentally, the constitution of each of film-forming vacuum vessels 504, 505 and 507 shown in FIG. 5 is the same as that of film-forming vacuum vessel 202 shown in FIG. 2.

The film-forming vacuum vessel 202 is provided with an exhaust pipe 211 for exhausting (or evacuating) the inside of the film-forming vacuum vessel 202 including the inside of the discharge chamber 203. The exhaust pipe 211 is provided with a throttle valve (not shown) for controlling the inner pressure of the discharge chamber 203. The exhaust pipe 211 provided with the exhaustion regulating valve is connected to an exhaust system comprising a vacuum pump (not shown).

Reference numeral 218 indicates a gas gate provided with a separation gas introduction pipe 218' which is provided on each of the substrate carrying-in side and the substrate carrying-out side of the film-forming vacuum vessel 202. The film-forming vacuum vessel 202 is communicated with other vacuum vessel such as other film-forming vacuum vessel, a substrate delivery vacuum vessel, or a substrate tee-up vacuum vessel situated next to the film-forming vacuum vessel 202 through the gas gate 218, where the web substrate 201 is moved into the film-forming vacuum vessel 202 from the vacuum vessel situated on the substrate carrying-in side or the web substrate 201 is moved from the film-forming vacuum vessel 202 into the vacuum vessel situated on the substrate carrying-out side through the gas gate 218.

Reference numeral 204 indicates a raw material gas introduction means provided in the discharge chamber 203. The raw material gas introduction means 204 comprises a plurality of gas feed pipes each having a number of gas release holes to release a raw material gas against the web substrate 201 in the discharge chamber 203. The raw material gas introduction means 204 is connected to a raw material gas supply means (not shown) comprising a plurality of gas reservoirs (not shown) each containing a prescribed raw material gas therein.

Reference numeral 221 indicates an RF power introduction electrode provided in the discharge chamber 203. The RF power introduction electrode 221 is electrically connected to an RF power source 220.

The RF power introduction electrode 221 serves to supply an RF power from the RF power source 220 into the discharge chamber 203, where raw material gas introduced into the discharge chamber 203 through the raw material gas introduction means 204 is exited and decomposed to produce a plasma by virtue of energy of the RF power supplied whereby causing the formation of a deposited film on the web substrate 201.

Reference numeral 208 indicates a preheating means comprising an infrared lamp heater unit which is arranged in the film-forming vacuum vessel 202. The preheating means 208 is provided above the passage of the web substrate 201 so as to pre-heat the web substrate 201 from above. Reference numeral 212 indicates a temperature control mechanism for the preheating means 208 which is electrically connected to the preheating means 208. Reference numeral 217 indicates a thermocouple provided in the preheating means 208.

Reference numeral 205 indicates a regular heating means comprising an infrared lamp heater unit which is arranged in the film-forming vacuum vessel 202. The regular heating means 205 is provided above the passage of the web substrate 201 so as to heat the web substrate 201 from above. Reference numeral 209 indicates a temperature control mechanism for the regular heating means 205 which is electrically connected to the regular heating means 205. Reference numeral 214 indicates a thermocouple provided in the regular heating means 205.

The preheating means 208 serves to provisionally heat the web substrate 201 before the web substrate is transported into the discharge chamber 203, and the regular heating means 205 serves to substantially heat the provisionally heated web substrate to a prescribed substrate temperature required for the film formation on the web substrate 201 in the discharge chamber 203.

Description will be made of FIGS. 3 and 4. The apparatus shown in FIGS. 3 and 4 is the same as that shown in FIG. 2, except that the discharge chamber 203 by means of RF plasma CVD in FIG. 2 is changed to a discharge chamber 302 by means of VHF plasma CVD as will be described below The constitution of the discharge chamber 302 shown in FIG. 3 is detailed in FIG. 4.

In FIGS. 3 and 4, reference numeral 301 indicates indicates a web substrate (corresponding to the substrate 101 in FIG. 1) which is transported in a direction shown by an arrow mark (see, FIG. 3). Reference numeral 300 indicates a film-forming vacuum vessel having a discharge chamber 302 in a substantially rectangular form whose length in a direction for the web substrate 301 to be transported is relatively long. The upper wall of the discharge chamber 302 has an opening as shown in FIGS. 3 and 4. At the upper wall of the discharge chamber 302 has an opening-adjusting member (not shown) for adjusting the length of the opening in the transportation direction of the web substrate. Here, the web substrate 301 which is moving serves as a wall member to cover the opening of the discharge chamber 302 so that the inside of the discharge chamber 302 is enclosed to form an enclosed discharge space between the web substrate 301 and the discharge chamber 302. A film is deposited on a surface of the web substrate 301 which is exposed to the discharge space. The film-forming vacuum vessel 300 and the discharge chamber 302 are respectively made of a metal material and they are electrically connected with each other. Incidentally, the constitution of a film-forming vacuum vessels 506 shown in FIG. 5 is the same as that of film-forming vacuum vessel 300 shown in FIG. 3.

The film-forming vacuum vessel. 300 is provided with an exhaust pipe 311 for exhausting (or evacuating) the inside of the film-forming vacuum vessel 300 including the inside of the discharge chamber 302. The exhaust pipe 311 is provided with a throttle valve (not shown) for controlling the inner pressure of the discharge chamber 302. The exhaust pipe 311 provided with the exhaustion regulating valve is connected to an exhaust system comprising a vacuum pump (not shown).

Reference numeral 312 indicates a gas gate provided with a separation gas introduction pipe 312' which is provided on each of the substrate carrying-in side and the substrate carrying-out side of the film-forming vacuum vessel 300. The film-forming vacuum vessel 300 is communicated with other film-forming vacuum vessel situated next to the film-forming vacuum vessel 300 through the gas gate 312, where the web substrate 301 is moved into the film-forming vacuum vessel 300 from the film-forming vacuum vessel situated on the substrate carrying-in side or the web substrate 301 is moved from the film-forming vacuum vessel 300 into the film-forming vacuum vessel situated on the substrate carrying-out side through the gas gate 312.

Reference numeral 304 indicates a raw material gas introduction means provided at the bottom wall face the discharge chamber 302. The raw material gas introduction means 304 comprises a gas feed pipe having a number of gas release holes to release a raw material gas against the web substrate 301 in the discharge chamber 302. The raw material-gas introduction means 304 is connected to a raw material gas supply means (not shown) comprising a plurality of gas reservoirs (not shown) each containing a prescribed raw material gas therein.

Reference numeral 303 indicates a VHF antenna as a VHF power introduction electrode which is provided in the discharge chamber 302. The VHF antenna 303 as the VHF power introduction electrode is arranged in the discharge chamber 302 in a direction perpendicular to the transportation direction of the web substrate 301 (see, FIG. 4). The VHF antenna 303 is electrically connected to a VHF power source 314 through a coaxial cable. It is possible for the VHF antenna to be replaced by a VHF power introduction plate electrode.

As shown in FIG. 4, a sidewall of the discharge chamber 302 which is opposed to the VHF antenna 303 (that is, a front side wall of the discharge chamber 302 in the figure) comprises an exhaust punching board for confining a VHF power supplied by the VHF antenna 303 within the discharge chamber 302 while exhausting the inside of the discharge chamber 302 through the exhaust punching board which is in communication with the exhaust pipe 311 provided with the throttle valve.

The RF antenna 303 power serves to supply a VHF power from the VHF power source 314 into the discharge chamber 302, where raw material gas introduced into the discharge chamber 302 through the raw material gas introduction means 304 is exited and decomposed to produce a plasma by virtue of energy of the VHF power supplied whereby causing the formation of a deposited film on the web substrate 301.

In FIG. 3, reference numeral 306 indicates a preheating means comprising an infrared lamp heater unit which is arranged in the film-forming vacuum vessel 300. The preheating means 306 is provided above the passage of the web substrate 301 so as to pre-heat the web substrate 301 from above. Reference numeral 310 indicates a temperature control mechanism for the preheating means 306 which is electrically connected to the preheating means 306. Reference numeral 308 indicates a thermocouple provided in the preheating means 306. Reference numeral 305 indicates a regular heating means comprising an infrared lamp heater unit which is arranged in the film-forming vacuum vessel 300. The regular heating means 305 is provided above the passage of the web substrate 301 so as to heat the web substrate 301 from above. Reference numeral 309 indicates a temperature control mechanism for the regular heating means 305 which is electrically connected to the regular heating means 305. Reference numeral 309 indicates a thermocouple provided in the regular heating means 305.

The preheating means 306 serves to provisionally heat the web substrate 301 before the web substrate is transported into the discharge chamber 302, and the regular heating means 305 serves to substantially heat the provisionally heated web substrate to a prescribed substrate temperature required for the film formation on the web substrate 301 in the discharge chamber 302.

The roll-to-roll type continuous film-forming apparatus shown in FIG. 5 comprises a substrate delivery vacuum vessel 502 for delivering a web substrate 501, a film-forming vacuum vessel 504 for forming an n-type semiconductor layer (this film-forming vacuum vessel will be hereinafter referred to as "n-type semiconductor layer-forming vacuum vessel"), a film-forming vacuum vessel 505 for forming an RF i-type semiconductor layer (this film-forming vacuum vessel will be hereinafter referred to as "RF i-type semiconductor layer-forming vacuum vessel"), a film-forming vacuum vessel 506 for forming a VHF i-type semiconductor layer (this film-forming vacuum vessel will be hereinafter referred to as "VHF i-type semiconductor layer-forming vacuum vessel"), a film-forming vacuum vessel 507 for forming a p-type semiconductor layer (this film-forming vacuum vessel will be hereinafter referred to as "p-type semiconductor layer-forming vacuum vessel" ), and a substrate take-up vacuum vessel 503 for taking up the web substrate 501. The vacuum vessels 502, 504–507, and 503 are communicated with each other through a gas gate 518 provided with a separation gas introduction pipe (not shown). Each of the substrate delivery vacuum vessel 502 and the substrate take-up vacuum vessel 503 is provided with an exhaust pipe (not shown) having a throttle valve (not shown) which is connected to an exhaust system comprising a vacuum pump (not shown).

The internal structure of each of the n-type semiconductor layer-forming vacuum vessel 504, the RF i-type semiconductor layer-forming vacuum vessel 505, and the p-type semiconductor layer-forming vacuum vessel 507 is the same as that of the film-forming vacuum vessel shown in FIG. 2. The internal structure of the VHF i-type semiconductor layer-forming vacuum vessel 507 is the same as that of the film-forming vacuum vessel shown in FIGS. 3 and 4.

Briefly explaining, as shown in FIG. 5, in the n-type semiconductor layer-forming vacuum vessel 504, there are provided a discharge chamber 504' having an RF power introduction electrode 504'-1 and a raw material gas introduction means (not shown) provided therein, a preheating means 504-1, and a regular heating means 504-2. And the n-type semiconductor layer-forming vacuum vessel 504 is provided with an exhaust pipe (not shown). In the RF i-type semiconductor layer-forming vacuum vessel 505, there are provided a discharge chamber 505' having an RF power introduction electrode 505'-1 and a raw material gas introduction means (not shown) provided therein, a preheating means 505-1, and a regular heating means 505-2. And the RF i-type semiconductor layer-forming vacuum vessel 505 is provided with an exhaust pipe (not shown) In the VHF i-type semiconductor layer-forming vacuum vessel 506. there are provided a discharge chamber 506' having a VHF antenna 506'-1 as a VHF power introduction means and a raw material gas introduction means (not shown) provided therein, a preheating means 506-1, and a regular heating means 506-2. And the VHF i-type semiconductor layer-forming vacuum vessel 506 is provided with an exhaust pipe (not shown). In the p-type semiconductor layer-forming vacuum vessel 507, there are provided a discharge chamber 507' having an RF power introduction electrode 507'-1 and a raw material gas introduction means (not shown) provided therein, a preheating means 507-1, and a regular heating means 507-2. And the p-type semiconductor layer-forming vacuum vessel 507 is provided with an exhaust pipe (not shown).

Now, in the apparatus shown in FIG. 5, the web substrate 501 is paid out from a pay-out bobbin 510 having the web substrate wound thereon in a roll form which is provided in the substrate delivery vacuum vessel 502 and it is delivered through a steering roll, followed by being transported to sequentially pass through the n-type semiconductor layer-forming vacuum vessel 504, the RF i-type semiconductor layer-forming vacuum vessel 505, the VHF i-type semiconductor layer-forming vacuum vessel 506 and the p-type semiconductor layer-forming vacuum vessel 507, and the web substrate enters in the substrate take-up vacuum vessel 503 where it is taken up by and wound on a take-up bobbin 511 in a roll form provided in the substrate take-up vacuum vessel 503.

During the web substrate 501 is transported from the substrate delivery vacuum vessel 502 toward the substrate take-up vacuum vessel 503 in this way, on the web substrate 501, there are continuously formed an n-type semiconductor layer by the discharge chamber 504' provided in the n-type semiconductor layer-forming vacuum vessel 504, an RF i-type semiconductor layer by the discharge chamber 505' provided in the RF i-type semiconductor layer-forming vacuum vessel 505, a VHF i-type semiconductor layer by the discharge chamber 506' provided in the VHF i-type semiconductor layer-forming vacuum vessel 506, and a p-type semiconductor layer by the discharge chamber 507' provided in the p-type semiconductor layer-forming vacuum vessel 507, whereby a four-layered photoelectric conversion semiconductor layer with a p-i-n junction structure is formed on the web substrate 501. The web substrate 501 having the photoelectric conversion semiconductor layer thus formed thereon is successively transported into the substrate take-up vacuum vessel 503, where it is taken up by and wound on the take-up bobbin 511 in a roll form through a steering roll. When the photoelectric conversion semiconductor layer-bearing web substrate is wound on the take-up bobbin 511, it is possible that an interleaf 512 paid out from an interleaf bobbin having the interleaf wound thereon in a roll form provided in the substrate take-up vacuum vessel 503 is wound on the take-up bobbin 511 together with the photoelectric conversion semiconductor layer-bearing web substrate such that the Interleaf is present to protect the semiconductor layer-bearing face of the web substrate. As the interleaf used in this case, an appropriate heat-resistant film is used. Specific examples of such heat-resistant film are polyimide resin films, Teflon films, and glass wool films.

In the VHF i-type semiconductor layer-forming vessel 506, it is possible to apply a desired bias voltage in the discharge chamber 506' upon forming the VHF i-type semiconductor layer in order to control the potential of the VHF plasma generated in the discharge chamber. By controlling the potential of the VHF plasma generated in the discharge chamber 506' in this way, there can be attained an improvement in the stability and repeatability of the VHF plasma and an improvement in the property of the VHF i-type semiconductor layer formed while preventing occurrence of a defect in the VHF i-type semiconductor layer. As the bias voltage, there can be used a D.C. voltage, a pulsating current voltage, an A.C. voltage, or a combination of these.

Separately, as the separation gas introduced into the gas gate 518 through the separation gas introduction pipe (not shown) provided at the gas gate 518, there can be mentioned rare gases such as Ar gas, He gas, Ne gas, Kr gas, Xe gas and Rn gas. Besides, dilution gases such as $H_2$ gas and the like which are used in the formation of a semiconductor layer are also usable.

In the operation of the apparatus shown in FIG. 5, it is important that the web substrate 501 is transported so as to pass through the respective semiconductor layer-forming vacuum vessels at a prescribed transportation speed without suffering from kockling, torsion or warping. In the case where the web substrate 501 is magnetic, by supporting the web substrate using, for instance, a rotary magnet roller (not shown) comprising a magnetic body, it is possible to transport the web substrate along a desired route while maintaining it in a prescribed form. The transportation speed of the web substrate should be determined depending on film-forming conditions (for instance, the thickness of a semiconductor layer formed, the forming speed thereof, and the like) employed.

By using the apparatus shown in FIG. 5, it is possible to continuously stacking a plurality of semiconductor layers of a different conduction type to continuously form a photoelectric conversion semiconductor layer on a web substrate, where it is possible to uniform the thickness and property of each semiconductor layer. Thus, it is possible for each constituent semiconductor layer of the photoelectric conversion semiconductor layer to have uniform characteristics and fewer defects. This situation enables one to mass-produce a solar cell at a reasonable production cost.

In the following, the present invention will be described in more detail with reference to examples. It should be understood that these examples are only for the illustrative purposes and not intended to restrict the scope of the present invention.

EXAMPLE 1

In this example, there was continuously formed a photovoltaic element having a p-i-n junction structure comprising a non-single crystalline silicon-containing semiconductor material on a web substrate using the apparatus shown in FIG. 5 and mass-produced a solar cell having such configuration as shown in FIG. 1 as will be described below.

As previously, in the apparatus shown in FIG. 5, the internal structure of the n-type semiconductor layer-forming vacuum vessel 504, the RF i-type semiconductor layer-forming vacuum vessel 505, and the p-type semiconductor layer-forming vacuum vessel 507 is the same as that of the film-forming vacuum vessel shown in FIG. 2, and the internal structure of the VHF i-type semiconductor layer-forming vacuum vessel 507 is the same as that of the film-forming vacuum vessel shown in FIGS. 3 and 4.

In the following, description will be made of the steps adopted in the formation of a photovoltaic element on a web substrate with reference to FIGS. 2 to 5.

1. Provision of Web Substrate

As the web substrate 501, there was provided a substrate roll comprising a well-cleaned web substrate made of stainless steel SUS 430 having a thickness of 0.13 mm and a width of 300 mm and having a back reflection layer (103) comprising a 100 nm thick Ag film and a 1000 nm thick zinc oxide (ZnO) film as a transparent electrically conductive layer formed in this order thereon by means of a conventional roll-to-roll type film-forming apparatus by means of sputtering (not shown), which is wound on a pay-out bobbin (510) in a roll form.

2. Production of Photovoltaic Element (Solar Cell)

The pay-out bobbin 510 having the web substrate 501 having the back reflection layer and the transparent electrically conductive layer formed thereon was arranged in the substrate delivery vacuum vessel 502 of the apparatus shown in FIG. 5. From the pay-out bobbin 510, the web substrate 501 was paid out and delivered from the substrate delivery vacuum vessel 502, followed by passing through the gas gate 518, the n-type semiconductor layer-forming vacuum vessel 504, the gas gate 518, the RF i-type semiconductor layer-forming vacuum vessel 505, the gas gate 518, the VHF i-type semiconductor layer-forming vacuum vessel 506, the gas gate 518, the p-type semiconductor layer-forming vacuum vessel 507, and the gas gate 518 to enter in the substrate take-up vacuum vessel where the beginning portion of the web substrate 501 was fixed to and wound on the substrate take-up bobbin 511. And the transportation system of the web substrate was adjusted so that the web substrate could be continuously and smoothly transported from the substrate delivery vacuum vessel 502 to the substrate take-up vacuum vessel 503 without being distorted or warped.

(1). Heat Treatment Prior To Layer Formation:

Then, each of the vacuum vessels 502–507 was evacuated until the inner pressure reached about 1 Torr through the corresponding exhaust pipe provided with the throttle valve by actuating the exhaust means. While continuing this evacuation, $H_2$ gas was flown into each of the gas gates 518 through the corresponding separation gas introduction pipe (not shown) at a flow rate of 500 sccm. At the same time, He gas was introduced into each of the n-type semiconductor layer-forming vacuum vessel 504, the RF i-type semiconductor layer-forming vacuum vessel 505, the VHF i-type semiconductor layer-forming vacuum vessel 506, and the p-type semiconductor layer-forming vacuum vessel 507 at a flow rate of 500 sccm through the raw material gas introduction means provided in the discharge chamber of each of the vacuum vessels 504–507, and by measuring the inner pressure of each of the vacuum vessels 504–507 by the pressure gage (not shown) and adjusting the opening extent of the throttle valve provided at the exhaust pipe based on the reading on the pressure gage, the inner pressure of each of the vacuum vessels 504–507 was maintained at 2.0 Torr. Then, the preheating means 504-1, 505-1, 506-1, and 507-1 in the vacuum vessels 504–507 were actuated to heat the inside atmosphere of each of the vacuum vessels 504–507 including the discharge chambers 504'–507' such that such that the temperature of the web substrate 501 became 400° C., where this heating was continued for one hour, whereby the inside of each of the vacuum vessels 504–507 was subjected to baking treatment to release and remove impurity gas components present therein.

After this, the introduction of the He gas Into each of the vacuum vessels 504–507 was terminated.

While continuing the evacuation of the inside of each of the vacuum vessels 502–507 and while continuing the introduction of the $H_2$ gas at a flow rate of 500 sccm into the respective gas gates 518, the web substrate 501 was stated moving at a transportation speed of 500 mm/minute from the substrate delivery vacuum vessel 502 toward the substrate take-up vacuum vessel 503, and a three-layered photoelectric conversion layer comprising an n-type semiconductor layer, a VHF i-type semiconductor layer, and a p-type semiconductor layer was continuously formed on the transparent electrically conductive layer of the web substrate 501 in the following manner. In this example. no RF i-type semiconductor layer was formed. Therefore, the RF i-type semiconductor layer-forming vacuum vessel 505 was not used.

(2). Formation of N-type Semiconductor Layer:

The formation of the n-type semiconductor layer was conducted in the n-type semiconductor layer-forming vacuum vessel 504 having the discharge chamber 504' shown in FIG. 5 which is corresponding to the film-forming vacuum vessel 202 having the discharge chamber 203 shown in FIG. 2.

The procedures adopted for the formation of the n-type semiconductor layer will be explained with reference to FIG. 2.

In the film-forming vacuum vessel 202 shown in FIG. 2, the temperature control mechanism 212 is regulated so that a temperature value indicated by the thermocouple 217 in the preheating means 208 becomes 350° C., and the web substrate 201 (that is, 501 in FIG. 5) is heated by the preheating means 208. Similarly, the temperature control mechanism 209 is regulated so that a temperature value indicated by the thermocouple 214 in the regular heating means 205 becomes 350° C., and the web substrate 201 (that is, 501 in FIG. 5) is heated by the regular heating means 205. After this, $SiH_4$ gas, $PH_3/H_2$ gas ($PH_3$ gas diluted to 2% by $H_2$ gas), and $H_2$ gas are introduced into the discharge chamber 203 through the raw material gas introduction means 204 at respective flow rates of 40 sccm, 50 sccm, and 500 sccm. Then, the inner pressure (the gas pressure) of the discharge chamber 203 is controlled to 1.1 Torr by means of the vacuum pump and through the exhaust pipe 211 while regulating the opening extent of the throttle valve provided at the exhaust pipe 211. Thereafter, the RF power source 220 is switched on to supply an RF power (with a frequency of 13.56 MHz) of 50 W into the discharge chamber 203 through the RF power introduction electrode 221 to generate plasma discharge in the discharge chamber 203, where the raw material gases introduced into the discharge chamber 203 are decomposed to cause the formation of an n-type semiconductor film as an n-type semiconductor layer at a thickness of 40 nm on the web substrate 201.

In this way, there was formed an n-type semiconductor layer on the transparent electrically conductive layer of the web substrate 501.

The conditions for the formation of the n-type semiconductor layer are shown in Table 1.

(3). Formation of VHF I-type Semiconductor Layer:

The formation of the VHF i-type semiconductor layer on the n-type semiconductor layer was conducted in the VHF i-type semiconductor layer-forming vacuum vessel 506 having the discharge chamber 506' shown in FIG. 5, which is corresponding to the film-forming vacuum vessel 300 having the discharge chamber 302 shown in FIGS. 3 and 4, under conditions shown in Tables 1 and 2. Particularly, fifty seven VHF i-type semiconductor layers (see, Table 2) are continuously formed on the previously formed n-type semiconductor layer of the web substrate 501 (301. see FIG. 3) respectively over every 1 m length of the web substrate in the transportation direction of the web substrate respectively under different conditions as shown in Tables 1 and 2.

The procedures adopted for the formation of each of the VHF i-type semiconductor layers will be explained with reference to FIGS. 3 and 4.

In the film-forming vacuum vessel 300 shown in FIG. 3, the temperature control mechanism 310 is regulated so that a temperature value indicated by the thermocouple 308 in the preheating means 306 becomes 350° C., and the web substrate 301 (that is, 501 in FIG. 5) is heated by the preheating means 306. Similarly, the temperature control mechanism 309 is regulated so that a temperature value indicated by the thermocouple 307 in the regular heating means 305 becomes 350° C., and the web substrate 301 (that is, 501 in FIG. 5) is heated by the regular heating means 305.

After this, $SiH_4$ gas, $GeH_4$ gas, and $H_2$ gas are introduced into the discharge chamber 302 through the raw material gas introduction means 304 at respective flow rates as shown in Table 3 in each case. In this case, the SiH, gas and $GeH_4$ gas are introduced respectively at a flow rate of 30 sccm, 40 sccm, 50 sccm, 60 sccm or 70 sccm, where the flow rate of the $SiH_4$ gas and $GeH_4$ gas as a whole (that is, the total raw material gas) is 60 sccm, 80 sccm, 100 sccm, or 140 sccm as shown in Table 2.

Then, the inner pressure (the gas pressure) of the discharge chamber 302 is controlled to 25 mTorr by means of the vacuum pump and through the exhaust punching board 305 and the exhaust pipe 311 while regulating the opening extent of the throttle valve provided at the exhaust pipe 311 in each case. Thereafter, in each case, the VHF power source 314 is switched on to supply a VHF power (with a frequency of 100 MHz) of a prescribed wattage in a range of from 150 to 1450 W as shown in Tables 1 and 2 into the discharge chamber 302 through the VHF antenna 303 to generate plasma discharge in the discharge chamber 302, where the raw material gases introduced into the discharge chamber 302 are decomposed to cause the formation of an i-type semiconductor film as the VHF i-type semiconductor layer on the n-type semiconductor layer of the web substrate 301 in each case.

Figure 6:
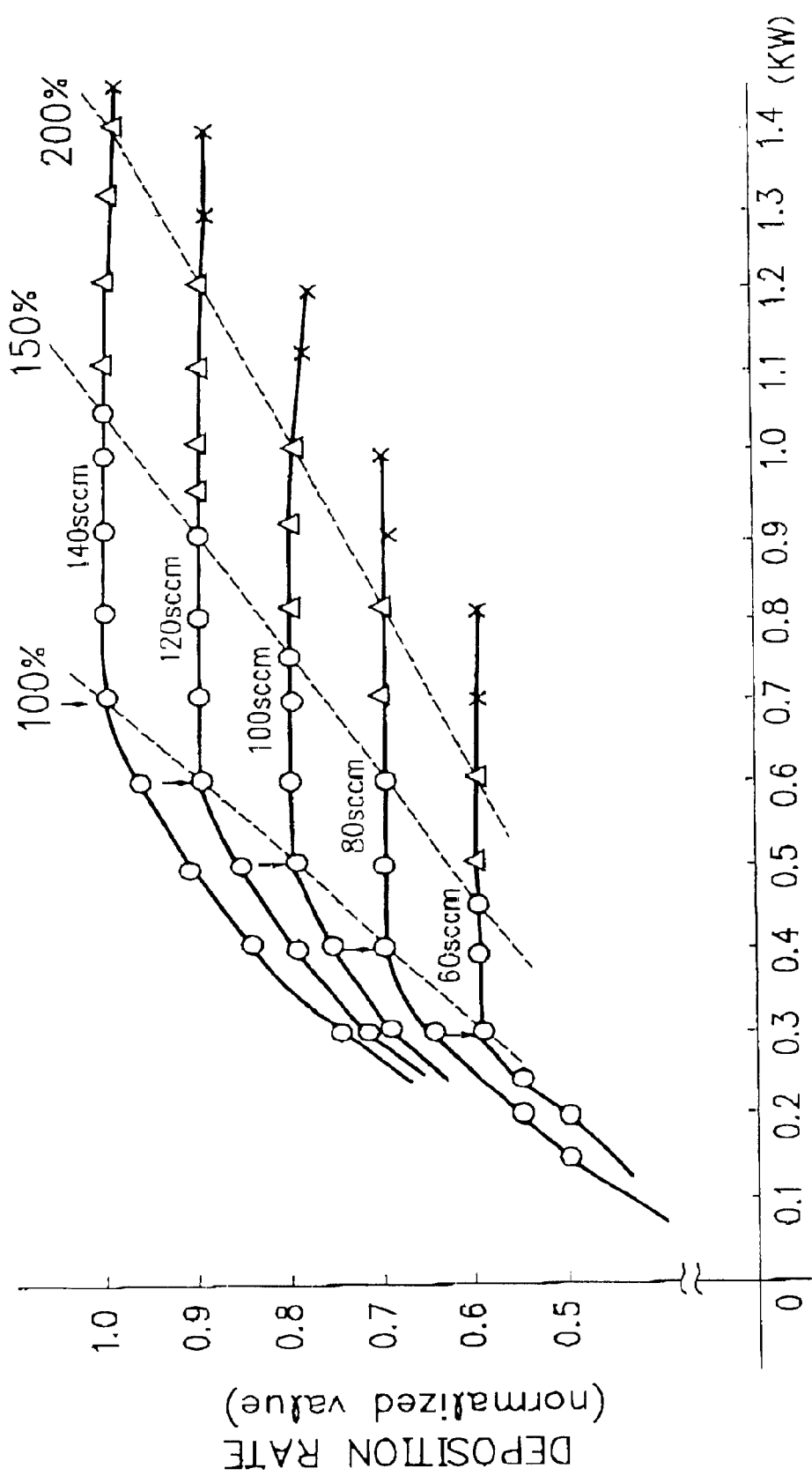

In the above, when the fifty seven VHF i-type semiconductor layers are continuously formed on the n-type semiconductor layer of the web substrate 501 (301, see FIG. 3) respectively over every 1 m length of the web substrate in the transportation direction of the web substrate respectively under different conditions as shown in Tables 1 and 2, there is adopted the following manner. That is, after a first VHF i-type semiconductor layer having a thickness of 120 nm is formed on the n-type semiconductor layer of the web substrate over 1 m length thereof under conditions of 60 sccm for the flow rate of the raw material gas ($SiH_4$ gas+$GeH_4$ gas) and 200 W for the wattage of the VHF power applied, the wattage of the VHF power is changed to 250 W in order to successively form a second VHF i-type semiconductor layer. At this time, the area of the opening (in the transportation direction of the web substrate) of the discharge chamber 302 to which the film-forming face of the web substrate is exposed is adjusted by means of the opening adjusting member (not shown) provided at the discharge chamber 302 so that the VHF i-type semiconductor layer involved can be formed at a thickness of 120 nm. To adjust the area of the opening of the discharge chamber 302 by means of the opening adjusting member in this way can be conducted on the basis of previously established data with respect to deposition rates (film-forming speeds in other words) under various film-forming conditions for forming VHF i-type semiconductor layers as shown in FIG. 6.

In this way, there were continuously formed 9 VHF i-type semiconductor layers in the case of 60 sccm for the flow rate of the raw material gas ($SiH_4$+$GeH_4$), 11 VHF i-type semiconductor layers in the case of 80 sccm for the flow rate the raw material gas ($SiM_4$+$GeH_4$), 10 VHF i-type semiconductor layers in the case of 100 sccm for the flow rate of the raw material gas ($SiH_4$+$GeH_4$), 13 VHF i-type semiconductor layers in the case of 120 sccm for the flow rate of the raw material gas ($SiH_4$+$GeH_4$), and 14 VHF i-type semiconductor layers in the case of 140 sccm for the flow rate of the raw material gas ($SiH_4$+$GeH_4$) respectively on n-type semiconductor layer of the web substrate over every 1 m length of the web substrate in the transportation direction. Incidentally, FIG. 6 is a graph for these VHF i-type semiconductor layers, showing their deposition rates with respect to the flow rates of the raw material gas ($SiH_4$+$GeH_4$) and the wattages of the VHF powers upon their formation.

Thus, there were formed 57 VHF i-type semiconductor layers successively on the previously formed n-type semiconductor layer of the web substrate 501.

(4). Formation of P-type Semiconductor Layer:

The p-type semiconductor layer was formed on the entirety of the VHF i-type semiconductor layers formed under the different conditions on the n-type semiconductor layer of the web substrate in the above step (3) using the p-type semiconductor layer-forming vacuum vessel 507 having the discharge chamber 507' shown in FIG. 5 which is corresponding to the film-forming vacuum vessel 202 having the discharge chamber 203 shown in FIG. 2.

The procedures adopted for the formation of the p-type semiconductor layer will be explained with reference to FIG. 2.

In the film-forming vacuum vessel 202 shown in FIG. 2, the temperature control mechanism 212 is regulated so that a temperature value indicated by the thermocouple 217 in the preheating means 208 becomes 350° C., and the web substrate 201 (that is, 501 in FIG. 5) is heated by the preheating means 208. Similarly, the temperature control mechanism 209 is regulated so that a temperature value indicated by the thermocouple 214 in the regular heating means 205 becomes 350° C., and the web substrate 201 (that is, 501 in FIG. 5) is heated by the regular heating means 205. After this, $SiH_4$ gas, $BF_3/H_2$ gas ($BF_3$ gas diluted to 2% by $H_2$ gas), and $H_2$ gas are introduced into the discharge chamber 203 through the raw material gas introduction means 204 at respective flow rates of 5 sccm, 50 sccm, and 500 sccm. Then, the inner pressure (the gas pressure) of the discharge chamber 203 is controlled to 1.1 Torr by means of the vacuum pump and through the exhaust pipe 211 while regulating the opening extent of the throttle valve provided at the exhaust pipe 211. Thereafter, the RF power source 220 is switched on to supply an RF power (with a frequency of 13.56 MHz) of 500 W into the discharge chamber 203 through the RF power introduction electrode 221 to generate plasma discharge in the discharge chamber 203, where the raw material gases introduced into the discharge chamber 203 are decomposed to cause the formation of a p-type semiconductor film as a p-type semiconductor layer at a thickness of 10 nm on the web substrate 201.

In this way, there was formed a p-type semiconductor layer on the each of the VHF i-type semiconductor layers of the web substrate 501.

The conditions for the formation of the p-type semiconductor layer are shown in Table 1.

The above film-forming operation comprising the foregoing steps (2) to (4) was continuously conducted, where a three-layered photoelectric conversion layer having an n-i-p junction was continuously formed on the web substrate 501, and the web substrate was entirely taken up on and wound on the substrate take-up bobbin 511 in the substrate take-up vacuum vessel 503 in a roll form.

After this, the supply of the discharging power and the introduction of the raw material gases in each of the vacuum vessels 504–507 were terminated, and the heating means in these vacuum vessels were switched off. Then, $N_2$ gas was introduced into the vacuum vessels 502–507 through a gas introduction means (not shown), followed by sufficiently cooling the entire inside of the apparatus. Thereafter, the entire inside of the apparatus was returned to atmospheric pressure, and the take-up bobbin 511 having the web substrate with the three-layered photoelectric conversion semiconductor layer wound thereon in a roll form (this will be hereinafter referred to as "web substrate roll") was taken out from the substrate take-up vacuum vessel 302

(5). Formation of Transparent Electrode Layer:

The web substrate web roll obtained in the above was set in a conventional roll-to-roll type film-forming apparatus by means of sputtering (not shown), where a 80 nm thick ITO ($In_2O_3$+$SnO_2$) film as a transparent electrode layer was continuously formed on the three-layered photoelectric conversion semiconductor layer formed on the web substrate web 501.

Then, while delivering the web substrate 501 from the resultant roll, the web substrate was cut at every 1 m interval in the transportation direction by means of a cutting machine (not shown) to obtain 57 rectangular photovoltaic elements each having a width of 300 mm (30 cm) and a length of 1 m.

Then, the beginning portion of each of the resultant 57 photovoltaic elements was cut at an equal interval of 5 cm in the width direction and in the longitudinal direction to obtain 20 element samples having a size of 5 cm×5 cm.

Thus, there were obtained 57 sample groups each comprising 20 element samples. For each of the resultant element samples, on the transparent electrode layer thereof, there was formed a collecting electrode comprising Al by means of conventional vacuum evaporation using a patterning mask, followed by fixing a pair of power output electrodes respectively to the substrate and the collecting electrode. Thus, there were obtained 20 solar cell samples having such configuration as shown in FIG. 1 for each of the foregoing 57 photovoltaic elements, that is, 57 solar cell sample groups each comprising 20 solar cell samples for each of the foregoing 57 photovoltaic elements.

Evaluation

1. As will be understood from FIG. 6, there is a tendency in that the deposition rate of the VHF i-type semiconductor layer is increased and saturated in proportion to the wattage of the VHF power supplied. Of the saturated levels of the deposition rate of the VHF i-type semiconductor layer, the minimum wattage of the VHF power is defined as a VHF power wattage required for 100% of the raw material gas in the present invention.

2. For each solar cell sample of each of the foregoing 57 solar cell sample groups, measurement was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$) [=a maximum power generated per a unit area (mW/cm$^2$)/intensity of incident light per a unit area (mW/cm$^2$)]. Separately, for each solar cell sample of each of the foregoing 57 solar cell sample groups, a prescribed voltage of a direct current was applied to the solar cell sample through the pair of power output electrodes without irradiating said pseudo sunlight, where measurement of its I-V characteristics was conducted to obtained an I-V characteristic curve. From the gradient of the I-V characteristic curve, namely based on a resistance component in the vicinity of 0 V of the I-V characteristics, there was obtained a shunt resistance (Rs). Particularly, a survival rate for the solar cell samples of each of the 57 solar cell sample groups was evaluated in the following manner. That is, when a given solar cell sample has a shunt resistance (Rs) of $10^4$ $\Omega m^2$ or more on the basis of a resistance component in the vicinity of 0 V of the I-V characteristics, the solar cell sample is made to be acceptable; when a given solar cell sample has a shunt resistance (Rs) of less than $10^4$ $\Omega cm^2$, the solar cell sample is made to be unacceptable; and for the 20 solar cell samples of each of the 57 solar cell sample groups, the proportion of those which are evaluated to be acceptable to the total solar cell samples is made to be a survival rate.

In FIG. 6, the survival rates for all the solar cell sample groups are shown on the basis of the following criteria.

○; a case wherein the survival rate is in a rage of from 98% to 100%;

Δ: a case wherein the survival rate is in a rage of from 96% to less than 98%; and ×: a case wherein the survival rate is less than 96%.

Based on Table 2 and the results shown in FIG. 6, the following facts are understood. That is, with respect to the flow rate of the raw material gas (SiH$_4$+GeH$_4$), when the wattage of the VHF power supplied exceeds a value of 2 times (200%) that of a VHF power required for decomposing 100% of the raw material gas, the survival rate for the solar cell samples becomes ×; when the wattage of the VHF power supplied exceeds a value of 1.5 times (150%) that of a VHF power required for decomposing 100% of the raw material gas, the survival rate for the solar cell samples becomes Δ; and when the wattage of the VHF power supplied is in a range of less than a value of 2 times, preferably in a range of a value of 1.5 times or less of a VHF power required for decomposing 100% of the raw material gas, the survival rate for the solar cell samples is high enough, where the solar cell samples have satisfactory solar cell characteristics.

EXAMPLE 2

In view of the results in Example 1 in that the solar cell sample group whose VHF i-type semiconductor layers having been formed under the condition of making the wattage of the VHF power supplied to be 1.5 times that of a VHF power required for decomposing 100% of the raw material gases as a whole (where SiH$_4$ gas: 40 sccm, GeH$_4$ gas: 40 sccm, VHF power: 600 w) was evaluated to be excellent in terms of the survival rate, the procedures for forming this solar cell sample group in Example 1 were repeated except for varying the frequency (100 MHz) in a range of from 10 MHz to 1000 MHz as shown in Table 3 to obtain 20 solar cell samples for each frequency, namely 14 solar cell sample groups each comprising 20 solar cell samples.

Evaluation

For each solar cell sample of each of the 14 solar cell sample groups, evaluation was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$). And for the 20 solar cell samples of each of the 14 solar cell sample groups, there was obtained an average photoelectric conversion efficiency ($\eta$). The resultant average photoelectric conversion efficiencies of the 14 solar cell sample groups are collectively shown in Table 3 in terms of the normalized value and also graphically shown in FIG. 7. In addition, a survival rate for the 20 solar cell samples of each of the 14 solar cell sample groups was evaluated in the same manner as in Example 1. The evaluated survival rates are collectively shown in Table 3 in the same manner as in Example 1.

Figure 7:
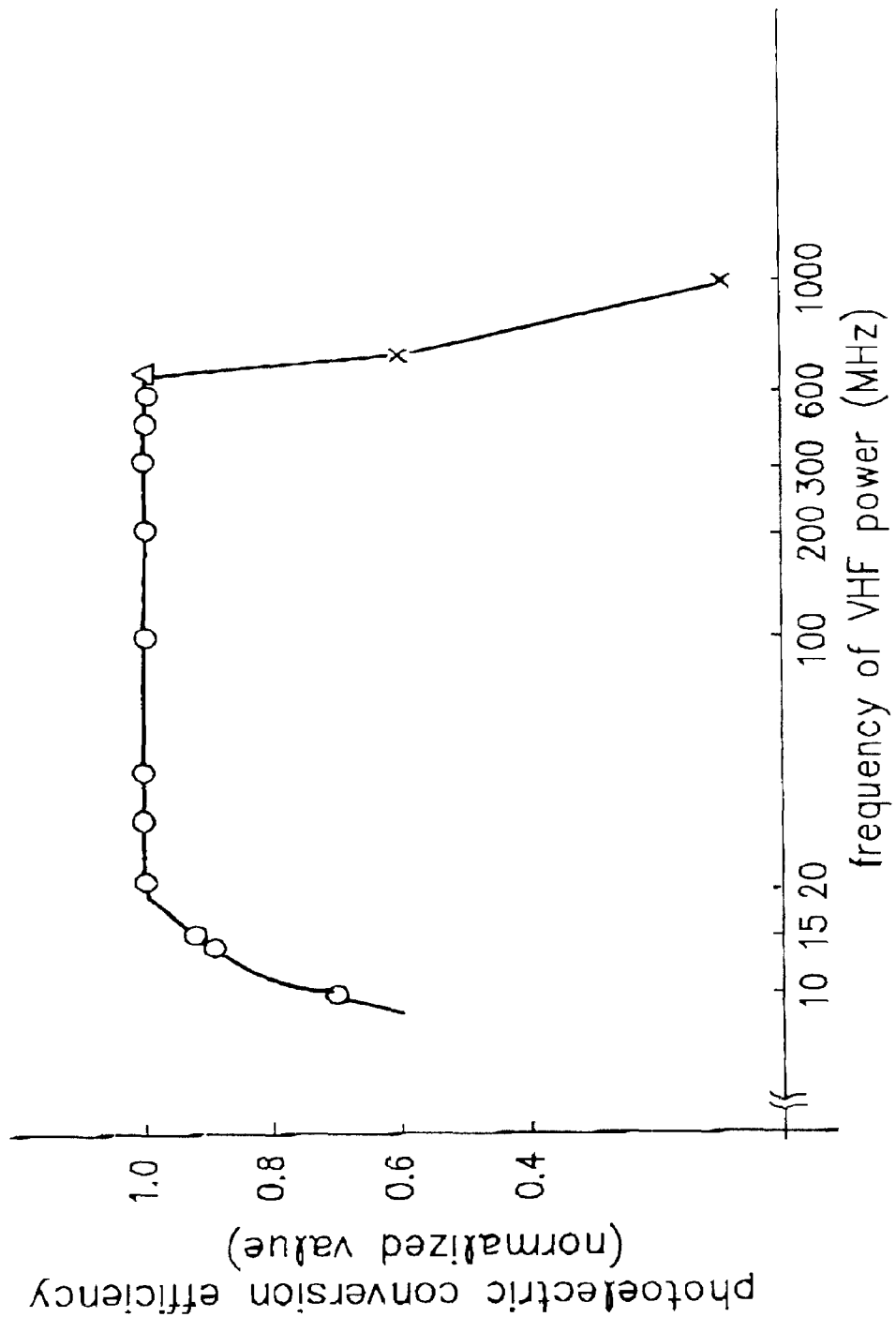

From the results shown in Table 3 and FIG. 7, the following facts are understood. That is, there is a tendency in that when the frequency of the VHF power supplied is less than 20 MHz, the photoelectric conversion efficiency ($\eta$) of a solar cell obtained is lowered. The reason for this is considered mainly due to a decrease in the fill factor (F.F.). In the case where the frequency of the VHF power supplied exceeds 500 MHz, there is a tendency in that the photoelectric conversion efficiency ($\eta$) of a solar cell obtained is somewhat lowered and the survival rate becomes Δ. And in the case where the frequency of the VHF power supplied exceeds 600 MHz, there is a tendency in that the photoelectric conversion efficiency ($\eta$) of a solar cell obtained is significantly lowered and the survival rate becomes ×.

In this connection, it is understood that when the frequency of the VHF power supplied is made to be in a range of from 15 MHz to 550 MHz, there can be obtained solar cells having a satisfactory photoelectric conversion efficiency ($\eta$), and when the frequency of the VHF power supplied is made to be in a range of from 20 MHz to 500 MHz, there can be obtained solar cells having an excellent photoelectric conversion efficiency ($\eta$) and having a satisfactory survival rate.

EXAMPLE 3

The procedures of Example 1 were repeated, except that prior to forming the VHF i-type layer, an RF i-type semiconductor layer was formed by using the RF i-type semiconductor-forming vacuum vessel 505 (corresponding to the film-forming vacuum vessel 202 of FIG. 2) in the apparatus shown in FIG. 5 and under conditions shown in the column "RF i-type semiconductor layer" of Table 4, to obtain 57 solar cell sample groups each comprising 20 solar cell samples.

Evaluation

For each solar cell sample of each of the above 57 solar cell sample groups, measurement was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$). Separately, there was evaluated a survival rate for the solar cell samples of each of the foregoing 57 solar cell sample groups in the same manner as in Example 1. And the evaluated survival rates for all the 57 solar cell sample groups are collectively shown in FIG. 8 in the same manner as in Example 1.

Figure 8:
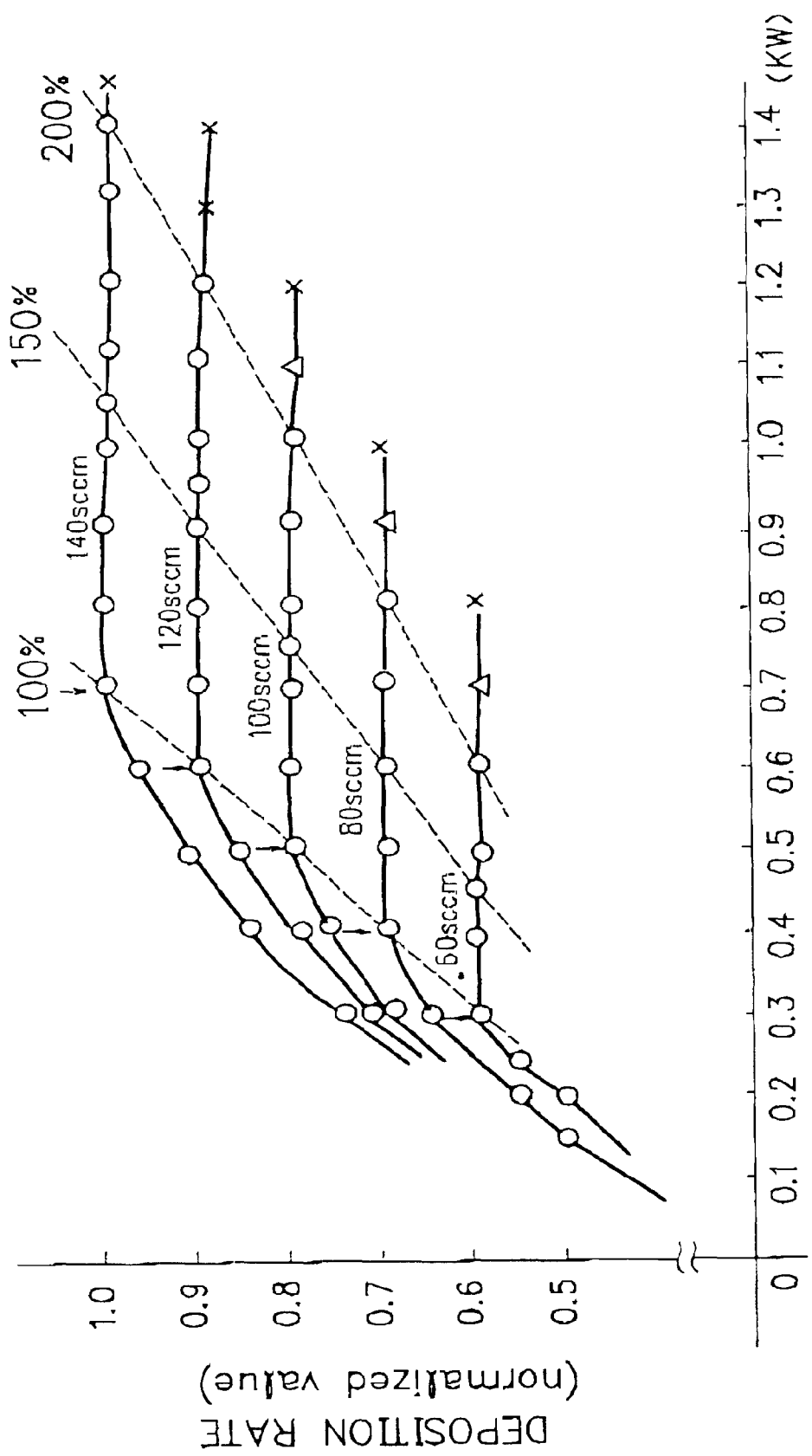

Based the results shown in FIG. 8, the following facts are understood. That is, with respect to the flow rate of the raw material gas (SiH$_4$+GeH$_4$), when the wattage of the VHF power supplied exceeds a value of 2 times (200%) that of a VHF power required for decomposing 100% of the raw material gas, the survival rate for the solar cell samples becomes $\Delta$ or x; and when the wattage of the VHF power supplied is a value in a range of less than 2 times (200%) that of a VHF power required for decomposing 100% of the raw material gas, the survival rate for the solar cell samples becomes excellent. In addition, as will be understood by comparing the results in this example with those in Example 1, by forming the RF i-type semiconductor layer prior to forming the VHF i-type semiconductor layer, it is possible to widen the ranges of the conditions capable of forming a desirable photoelectric conversion semiconductor layer having excellent characteristics.

EXAMPLE 4

In view of the results in Example 3 in that the solar cell sample group in which the RF i-type semiconductor layer was formed prior to forming the VHF i-type semiconductor layer and the VHF i-type semiconductor layer was formed under the condition of making the wattage of the VHF power supplied to be 2 times that of a VHF power required for decomposing 100% of the raw material gas (SiH$_4$ gas+GeH$_4$ gas) [where SiH$_4$ gas: 40 sccm, GeH$_4$ gas: 40 sccm, VHF power: 800 w] was evaluated to be excellent in terms of the survival rate, the procedures for forming this solar cell sample group in Example 3 were repeated except for varying the frequency in a range of from 10 MHz to 1000 MHz as shown in Table 5 to obtain 20 solar cell samples for each frequency, namely 14 solar cell sample groups each comprising 20 solar cell samples.

Evaluation

For each solar cell sample of each of the 14 solar cell sample groups, evaluation was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$). And for the 20 solar cell samples of each of the 14 solar cell sample groups, there was obtained an average photoelectric conversion efficiency ($\eta$). The resultant average photoelectric conversion efficiencies of the 14 solar cell sample groups are collectively shown in Table 5 in terms of the normalized value and also graphically shown in FIG. 9. In addition, a survival rate for the 20 solar cell samples of each of the 14 solar cell sample groups was evaluated in the same manner as in Example 1. The evaluated survival rates are collectively shown in Table 5 in the same manner as in Example 1.

From the results shown in Table 5 and FIG. 9, the following facts are understood. That is, there is a tendency in that when the frequency of the VHF power supplied is less than 20 MHz, the photoelectric conversion efficiency ($\eta$) of a solar cell obtained is lowered. The reason for this is considered mainly due to a decrease in the fill factor (F.F.). In the case where the frequency of the VHF power supplied exceeds 550 MHz, there is a tendency in that the photoelectric conversion efficiency ($\eta$) of a solar cell obtained is somewhat lowered. And in the case where the frequency of the VHF power supplied exceeds 600 MHz, there is a tendency in that the photoelectric conversion efficiency ($\eta$) of a solar cell obtained is significantly lowered and the survival rate becomes x. However, by forming the RF i-type semiconductor layer prior to forming the VHF i-type semiconductor layer. the survival rate at 550 MHz became good enough ($\circ$).

In this connection, it is understood that when the frequency of the VHF power supplied is made to be in a range of from 15 MHz to 550 MHz, there can be obtained solar cells having a satisfactory photoelectric conversion efficiency ($\eta$) and when the frequency of the VHF power supplied is made to be in a range of from 20 MHz to 550 MHz, there can be obtained solar cells having an excellent photoelectric conversion efficiency ($\eta$) and having a satisfactory survival rate.

EXAMPLE 5

In view of the results in Example 3 in that the solar cell sample group in which the RF i-type semiconductor layer was formed prior to forming the VHF i-type semiconductor layer and the VHF i-type semiconductor layer was formed under the condition of making the wattage of the VHF power supplied to be 2 times that of a VHF power required for decomposing 100% of the raw material gas (SiH$_4$ gas+GeH$_4$ gas) [where SiH$_4$ gas: 40 sccm, GeH$_4$ gas: 40 sccm, VHF power: 800 w] was evaluated to be excellent in terms of the survival rate, the procedures for forming this solar cell sample group in Example 3 were repeated except for varying the substrate temperature upon forming the VHF i-type semiconductor layer in a range of from 10° C. to 550° C. to obtain 20 solar cell samples for each substrate temperature, namely 10 solar cell sample groups each comprising 20 solar cell samples.

Evaluation

For each of the 20 solar cell samples of each solar cell sample group, evaluation was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$). And for the 20 solar cell samples of each solar cell sample group, there was obtained an average photoelectric conversion efficiency ($\eta$). The resultant average photoelectric conversion efficiencies of the 10 solar cell sample groups are collectively and graphically shown in FIG. 10. In addition, a survival rate for the 20 solar cell samples of each of the 10 solar cell sample groups was evaluated in the same manner as in Example 1.

From the results shown in FIG. 10 and the evaluated survival rates, the following facts are understood. That is, there is a tendency in that when the substrate temperature upon forming the VHF i-type semiconductor layer is less 200° C., the photoelectric conversion efficiency ($\eta$) of a solar cell obtained is lowered. The reason for this is considered mainly due to a decrease in the fill factor (F.F.). In the case where the substrate temperature upon forming the VHF i-type semiconductor layer exceeds 450° C., there is tendency that although the photoelectric conversion efficiency ($\eta$) of a solar cell obtained is good, the survival rate becomes $\Delta$ or $\times$.

Thus, there was obtained a finding that the substrate temperature upon forming the VHF i-type semiconductor layer is made to in a range of from 200° C. to 450° C., there can be obtained solar cells having a satisfactory photoelectric conversion efficiency ($\eta$), and when the substrate temperature is made to in a range of from 200° C. to 400° C., there can be obtained solar cells having an excellent photoelectric conversion efficiency ($\eta$) and having a satisfactory survival rate.

EXAMPLE 6

In this example, using a well-cleaned web substrate made of stainless steel SUS 430 having a thickness of 0.13 mm and a width of 300 mm and having a back reflection layer comprising a 100 nm thick Ag film and a 1000 nm thick zinc oxide (ZnO) film as a transparent electrically conductive layer formed in this order thereon as well as in Example 1, a number of triple cell type solar cells comprising a bottom cell having a p-i-n junction, a middle cell having a p-i-n junction and a top cell having a p-i-n junction stacked in the order on the transparent electrically conductive layer of the substrate.

In the bottom cell, a VHF i-type SiGe semiconductor layer was formed by means of VHF plasma CVD without forming an RF i-type semiconductor layer as a buffer layer. In the middle cell, an RF i-type semiconductor layer as a buffer layer was formed by means of RF plasma CVD and a VHF i-type SiGe semiconductor layer was formed by means of VHF plasma CVD, and in the top cell, an RF i-type semiconductor layer was formed by means of RF plasma CVD without forming a VHF i-type semiconductor layer.

In this example, there was used a modification of the apparatus shown in FIG. 5 comprising a middle cell-forming zone and a top cell-forming zone additionally provided between the p-type semiconductor layer-forming vacuum vessel 507 and the substrate take-up vacuum vessel 503, where the semiconductor layer-forming vacuum vessels 504–507 shown in FIG. 5 serve as a bottom cell-forming zone. Particularly, in this apparatus, between the p-type semiconductor layer-forming vacuum vessel 507 and the substrate take-up vacuum vessel 503, there are provided a middle cell-forming vacuum zone and a top cell-forming vacuum vessel, where the middle cell-forming zone comprises an n-type semiconductor layer-forming vacuum vessel having the same structure as the n-type semiconductor layer-forming vacuum vessel 504, an RF i-type semiconductor layer-forming vacuum vessel having the same structure as the RF i-type semiconductor layer-forming vacuum vessel 505, a VHF i-type semiconductor-forming vacuum vessel having the same structure as the VHF i-type semiconductor-forming vacuum vessel 506 and a p-type semiconductor layer-forming vacuum vessel having the same structure as the p-type semiconductor layer-forming vacuum vessel 507: the top cell-forming zone comprises an n-type semiconductor layer-forming vacuum vessel having the same structure as the n-type semiconductor layer-forming vacuum vessel 504, an RF i-type semiconductor layer-forming vacuum vessel having the same structure as the RF i-type semiconductor layer-forming vacuum vessel 505, and a p-type semiconductor layer-forming vacuum vessel having the same structure as the p-type semiconductor layer-forming vacuum vessel 507; and all the vacuum vessels are communicated with each other through gas gates in the same manner as in the apparatus shown in FIG. 5.

In the bottom cell-forming zone, a first photoelectric conversion semiconductor layer as a bottom cell having an n-i-p junction comprising an n-type semiconductor layer, a VHF i-type semiconductor layer and a p-type semiconductor layer was formed under the conditions shown in Table 1 except for fixing the flow rate of each of the SiH4 gas and GeH4 gas at 50 sccm and fixing the wattage of the VHF power (100 MHz) at 500 W.

In the middle cell-forming zone, a second photoelectric conversion semiconductor layer as a middle cell having an n-i-p junction comprising an n-type semiconductor layer, a buffer layer comprising an RF i-type semiconductor layer, a VHF i-type semiconductor layer and a p-type semiconductor layer was formed under conditions shown in Table 6. In this case, the frequency of the VHF power upon forming the VHF i-type layer was varied in a range of 10 MHz to 1000 MHz as shown in Table 5, where 14 different photoelectric conversion semiconductor layers each having a VHF semiconductor layer formed at a different frequency in the range of 10 MHz to 1000 MHz were continuously formed on the first photoelectric conversion layer over every 1 m length of the web substrate.

In the top cell-forming zone, a third photoelectric conversion semiconductor layer as a top cell having an n-i-p junction comprising an n-type semiconductor layer, an RF i-type semiconductor layer, and a p-type semiconductor layer was formed under conditions shown in Table 7.

The wattage (500 W) of the VHF power for the formation of the VHF i-type semiconductor layer in the formation of the bottom cell is 1 time that of a VHF power required for decomposing 100% of the raw material gas ($SiH_4$ gas+$GeH_4$ gas). The wattage (400 W) of the VHF power for the formation of the VHF i-type semiconductor layer in the formation of the middle cell is 0.8 time that of a VHF power required for decomposing 100% of the raw material gas ($SiH_4$ gas+$GeH_4$ gas).

Other solar cell-producing procedures were conducted as in Example 1. Thus, there were obtained 14 solar cell sample groups each comprising 20 triple cell type solar cell samples.

Evaluation

1. For each of the 20 triple cell type solar cell samples of each of the 14 solar cell sample groups, evaluation was conducted with respect to its I-V characteristics by positioning the triple cell type solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency ($\eta$). And for the 20 triple cell type solar cell samples of each of the 14 solar cell sample groups, there was obtained an average photoelectric conversion efficiency ($\eta$) In addition, a survival rate for the 20 triple cell type solar cell samples of each of the 14 solar cell sample groups was evaluated in the same manner as in Example 1.

The results obtained were similar to those in Example 4.

2. Some of the 20 triple cell type solar cell samples of each of the 14 solar cell sample groups were serialized, followed by being vacuum-sealed using a sealing resin and a protective film comprising polyvinylidene fluoride to obtain 14 solar cell modules.

A fixed resistor of 50 $\Omega$ was electrically connected to each of a pair of power output electrodes of each of the 14 solar cell modules. And these solar cell modules were allowed to stand outdoors for one year. Thereafter, for each of the solar cell modules, its photoelectric conversion efficiency (η) was evaluated in the same manner as in the above 1. And there was examined a degradation ratio occurred due to continuous irradiation of sunlight (the degradation ratio means a value obtained by dividing a deteriorated value of the photoelectric conversion efficiency by the initial photoelectric conversion efficiency) for each of the 14 solar cell modules. And for the solar cell modules whose constituent triple cell type solar cell samples having been obtained at a frequency of the VHF power in a range of from 15 MHz to 500 MHz, their average degradation ratio was obtained. Similarly, for the remaining solar cell modules whose constituent triple cell type solar cell samples having been obtained at a frequency of the VHF power in other range, their average degradation ratio was obtained. When the latter average degradation ratio was compared the former average degradation ratio, which is set at 1.0. As a result, it was found that the latter average degradation ratio is 0.8 which is inferior. In this connection, it is understood that the triple cell type solar cells having obtained at a frequency of the VHF power in a range of from 15 MHz to 500 MHz excel in fill factor (F.F.), photoelectric conversion efficiency (η) and degradation ratio occurred due to continuous irradiation of sunlight.

Hence, according to the present invention, it is possible to mass-produce a triple cell type solar cell having excellent solar cell characteristics using a VHF power with a frequency in a range of from 15 MHz to 500 MHz.

EXAMPLE 7

The procedures of Example 2 in which the frequency of the VHF power (400 W) upon forming the VHF i-type semiconductor layer is varied in a range of from 10 MHz to 1000 MHz as shown in Table 3 were repeated, except that the flow rate 40 sccm of the $SiH_4$ gas was maintained, no $GeH_4$ gas was used, the flow rate of the $H_2$ gas was changed to 1000 sccm in order to increase the dilution ratio of the $SiH_4$ gas by the $H_2$ gas, the inner pressure of the discharge chamber was made to be 30 mTorr, and the thickness of a VHF i-type semiconductor layer formed was made to be 1000 nm, to obtain 14 solar cell sample groups each comprising 20 solar cell samples.

In the above, the wattage (400 W) of VHF power is two times (200%) that of a VHF power required for decomposing the raw material gas ($SiH_4$ gas).

Further, in the above, the opening (that is, the plasma generation region to which the film-forming face of the web substrate is exposed) of the discharge chamber 302 (see, FIG. 3) was adjusted so as to extend in the transportation direction of the web substrate by means of the opening adjusting member provided at the discharge chamber, so that the VHF i-type semiconductor layer could be formed at a thickness of 1000 nm.

Evaluation

For each of the 20 solar cell samples of each of the 14 solar cell sample groups, evaluation was conducted with respect to its I-V characteristics by positioning the solar cell sample under the irradiation of pseudo sunlight of AM 1.5 (100 mW/cm$^2$). Based on the resultant I-V characteristics, there were obtained an open-circuit voltage (Voc), a fill factor (F.F.) and a photoelectric conversion efficiency (η). And for the 20 solar cell samples of each of the 14 solar cell sample groups, there was obtained an average photoelectric conversion efficiency (η). In addition, a survival rate for the 20 solar cell samples of each of the 14 solar cell sample groups was evaluated in the same manner as in Example 1.

Based on the results obtained in the above, there were obtained findings as will be described below.

That is, there is a tendency in that when the frequency of the VHF power supplied is less than 20 MHz, the photoelectric conversion efficiency (η) of a solar cell obtained is lowered. The reason for this is considered mainly due to a decrease in the fill factor (F.F.). In the case where the frequency of the VHF power supplied exceeds 500 MHz, there is a tendency in that the photoelectric conversion efficiency (η) of a solar cell obtained is somewhat lowered and the survival rate becomes Δ. And in the case where the frequency of the VHF power supplied exceeds 600 MHz, there is a tendency in that the photoelectric conversion efficiency (η) of a solar cell obtained is significantly lowered and the survival rate becomes ×.

In this connection, it is understood that when the frequency of the VHF power supplied is made to be in a range of from 15 MHz to 500 MHz, there can be obtained solar cells having a satisfactory photoelectric conversion efficiency (η), and when the frequency of the VHF power supplied is made to be in a range of from 20 MHz to 450 MHz, there can be obtained solar cells having an excellent photoelectric conversion efficiency (η) and having a satisfactory survival rate.

Incidentally, in each of the examples described in the above, there was used a bar-like shaped electrode as the cathode electrode for the formation of the VHF i-type layer, but this is not limitative. It is possible to use a plate electrode. In this case, by making the distance between the plate electrode and the substrate (the web substrate) to be in a range of from 5 to 30 mm and making the inner pressure of the discharge chamber to be in a range of from 1 to 10 Torr, there are obtained satisfactory results.

From the above description, it is understood that according to the present invention, it is possible to mass-produce a photovoltaic element (a solar cell) which excels in power output characteristics, particularly, in open-circuit voltage (Voc) and fill factor (F.F.). It is also possible to mass-produce a highly reliable photovoltaic element (a highly reliable solar cell) which is hardly deteriorated even when continuously used under severe environmental conditions over a long period of time.

TABLE 1 substrate: SUS430BA (thickness: 0.13 mm)
back reflection layer: Ag thin film (thickness: 100 nm)
transparent electrically conductive layer: ZnO thin film (thickness: 1 μm)
transparent electrode layer: ITO ($In_2O_3$ + $SnO_2$) thin film (thickness: 80 nm)
gate gas: introduced into each gas gate at 500 sccm

| | thickness (nm) | gas used & flow rate (sccm) | high frequency power [frequency (MHz)/ power (W)] | inner pressure | substrate temperature (° C.) |
|---|---|---|---|---|---|
| n-type semiconductor layer | 40 | $SiH_4$ 40<br>$PH_3/H_2$ 50<br>(diluted to 2%)<br>$H_2$ 500 | 13.56/50 | 1.1 Torr | 350 |
| RFi-type semiconductor layer | | | -- not formed -- | | |

TABLE 1-continued substrate: SUS430BA (thickness: 0.13 mm)
back reflection layer: Ag thin film (thickness: 100 nm)
transparent electrically conductive layer: ZnO thin film (thickness: 1 μm)
transparent electrode layer: ITO ($In_2O_3$ + $SnO_2$) thin film (thickness: 80 nm)
gate gas: introduced into each gas gate at 500 sccm

| | thickness (nm) | gas used & flow rate (sccm) | | high frequency power [frequency (MHz)/ power (W)] | inner pressure | substrate temperature (° C.) |
|---|---|---|---|---|---|---|
| VHF i-type semiconductor layer | 120 | * | | 100/ 150~1450 | 25 mTorr | 350 |
| p-type semiconductor layer | 10 | $SiH_4$ $BH_3H_2$ (diluted to 2%) $H_2$ | 5 50 500 | 13.56/500 | 1.1 Torr | 250 |

*$SiH_4$ + $GeH_4$: 60~140 sccm
$GeH_4/SiH_4 + GeH_4$: 50%
$H_2/SiH_4 + GeH_4$: 500%

TABLE 3 flow rate of the total raw material gas: 80 sccm
VHF power: 600 (W)

| frequency (MHz) | photoelectric conversion efficiency (normalized value) | survival rate |
|---|---|---|
| 10 | 0.7 | ○ |
| 13.56 | 0.9 | ○ |
| 15 | 0.92 | ○ |
| 20 | 1 | ○ |
| 30 | 1 | ○ |
| 50 | 1 | ○ |
| 100 | 1 | ○ |
| 200 | 1 | ○ |
| 300 | 1 | ○ |
| 400 | 1 | ○ |
| 500 | 1 | ○ |
| 550 | 1 | Δ |
| 600 | 0.6 | X |
| 1000 | 0.1 | X |

TABLE 2

(conditions for the formation of VHF i-type semiconductor layer)

flow rate of the total raw material gas (sccm)

| 60 | | 80 | | 100 | | 120 | | 140 | |
|---|---|---|---|---|---|---|---|---|---|
| VHF power (W) | VHF power normalized value (%) | VHF power (W) | VHF power normalized value (%) | VHF power (W) | VHF power normalized value (%) | VHF power (W) | VHF power normalized value (%) | VHF power (W) | VHF power normalized value (%) |
| | | 150 | 37.5 | | | | | | |
| 200 | 66.7 | 200 | 50 | | | | | | |
| 250 | 83.3 | | | | | | | | |
| 300 | 100 | 300 | 75 | 300 | 60 | 300 | 50 | 300 | 42.9 |
| 400 | 133 | 400 | 100 | 400 | 80 | 400 | 66.7 | 400 | 67.1 |
| 450 | 150 | | | | | | | | |
| 500 | 166.7 | 500 | 125 | 500 | 100 | 500 | 83.3 | 500 | 71.4 |
| 600 | 200 | 600 | 150 | 600 | 120 | 600 | 100 | 600 | 85.7 |
| 700 | 233 | 700 | 175 | 700 | 140 | 700 | 116.7 | 700 | 100 |
| | | | | 750 | 150 | | | | |
| 800 | 266.7 | 800 | 200 | 800 | 160 | 800 | 133.3 | 800 | 114.3 |
| | | 900 | 225 | 900 | 180 | 900 | 150 | 900 | 128.6 |
| | | | | | | 950 | 158.3 | | |
| | | 1000 | 250 | 1000 | 200 | 1000 | 166.7 | 1000 | 142.9 |
| | | | | | | | | 1050 | 150 |
| | | 1100 | 275 | 1100 | 220 | 1100 | 183.3 | 1100 | 157.1 |
| | | | | | | 1200 | 200 | 1200 | 171.4 |
| | | | | | | 1300 | 216.7 | 1300 | 185.7 |
| | | | | | | 1400 | 233.3 | 1400 | 200 |
| | | | | | | | | 1450 | 207.1 |

TABLE 4 substrate: SUS430BA (thickness: 0.13 mm)
back reflection layer: Ag thin film (thickness: 100 nm)
transparent electrically conductive layer: ZnO thin film (thickness: 1 $\mu$m)
transparent electrode layer: ITO ($In_2O_3$ + $SnO_2$) thin film (thickness: 80 nm)
gate gas: introduced into each gas gate at 500 sccm

|  | thickness (nm) | gas used & flow rate (sccm) | | high frequency power [frequency (MHz)/ power (W)] | inner pressure | substrate temperature (° C.) |
|---|---|---|---|---|---|---|
| n-type semiconductor layer | 40 | $SiH_4$<br>$PH_3/H_2$ (diluted to 2%)<br>$H_2$ | 40<br>50<br><br>500 | 13.56/<br>50 | 1.1 Torr | 350 |
| RF i-type semiconductor layer | 15 | $SiH_4$<br>$H_2$ | 20<br>500 | 13.56/<br>20 | 1.1 Torr | 350 |
| VHF i-type semiconductor layer | 120 | $SiH_4$<br>$GeH_4$<br>$H_2$ | 30~70<br>30~70<br>300~700 | 100/<br>150~1450 | 25 mTorr | 350 |
| p-type semiconductor layer | 10 | $SiH_4$<br>$BH_3/H_2$ (diluted to 2%)<br>$H_2$ | 5<br>50<br><br>500 | 13.56/<br>500 | 1.1 Torr | 250 |

TABLE 5 flow rate of the total raw material gas: 80 sccm
VHF power: 800 (W)

| frequency of the VHF power (MHz) | photoelectric conversion efficiency (normalized value) | survival rate |
|---|---|---|
| 10 | 0.7 | ○ |
| 13.56 | 0.9 | ○ |
| 15 | 0.92 | ○ |
| 20 | 1 | ○ |
| 30 | 1 | ○ |
| 50 | 1 | ○ |
| 100 | 1 | ○ |
| 200 | 1 | ○ |
| 300 | 1 | ○ |
| 400 | 1 | ○ |
| 500 | 1 | ○ |
| 550 | 1 | *○ |
| 600 | 0.6 | Δ |
| 1000 | 0.1 | X |

*improved point

TABLE 6

|  | thickness (nm) | gas used & flow rate (sccm) | | high frequency power [frequency (MHz)/ power (W)] | inner pressure | substrate temperature (° C.) |
|---|---|---|---|---|---|---|
| n-type semiconductor layer | 20 | $SiH_4$<br>$PH_3/H_2$ (diluted to 2%)<br>$H_2$ | 40<br>50<br><br>500 | 13.56/<br>50 | 1.1 Torr | 310 |
| RF i-type semiconductor layer | 15 | $SiH_4$<br>$H_2$ | 20<br>500 | 13.56/<br>20 | 1.1 Torr | 300 |
| VHF i-type semiconductor layer | 120 | $SiH_4$<br>$GeH_4$<br>$H_2$ | 60<br>40<br>500 | 100/<br>400 | 15 mTorr | 320 |
| p-type semiconductor layer | 10 | $SiH_4$<br>$BH_3/H_2$ (diluted to 2%)<br>$H_2$ | 5<br>50<br><br>500 | 13.56/<br>500 | 1.1 Torr | 250 |

TABLE 7

| | thickness (nm) | gas used & flow rate (sccm) | | high frequency power [frequency (MHz)/ power (W)] | inner pressure | substrate temperature (° C.) |
|---|---|---|---|---|---|---|
| n-type semiconductor layer | 20 | SiH$_4$<br>PH$_3$/H$_2$<br>(diluted to 2%)<br>H$_2$ | 40<br>50<br><br>500 | 13.56/<br>50 | 1.1 Torr | 300 |
| i-type semiconductor layer | 120 | SiH$_4$<br>H$_2$ | 200<br>500 | 13.56/<br>200 | 1.1 Torr | 250 |
| p-type semiconductor layer | 10 | SiH$_4$<br>BH$_3$/H$_2$<br>(diluted to 2%)<br>H$_2$ | 5<br>50<br><br>500 | 13.56/<br>500 | 1.1 Torr | 250 |

What is claimed is:

1. A process for producing a semiconductor device having a photoelectric conversion semiconductor layer formed by sequentially forming a p-type or n-type semiconductor layer composed of a non-single crystalline silicon series semiconductor material, an i-type semiconductor layer composed of a non-single crystalline silicon series semiconductor material, and an n-type or p-type semiconductor layer composed of a non-single crystalline silicon series semiconductor material on a substrate by means of plasma CVD, characterized in that at least one i-type semiconductor as said i-type semiconductor layer is formed in a discharge chamber having a cathode electrode by means of VHF plasma CVD using a silicon-containing raw material gas, wherein a VHF power of a wattage which is two times or less that of a VHF power required for decomposing 100% of said silicon-containing raw material gas is applied to said cathode electrode.

2. A process for producing a semiconductor device according to claim 1, wherein said semiconductor device is a photovoltaic element or a photosensor.

3. A process for producing a semiconductor device according to claim 1, wherein said VHF power is of a frequency in a range of from 15 MHz to 550 MHz.

4. A process for producing a semiconductor device according to claim 1, wherein said i-type semiconductor layer is formed at a substrate temperature in a range of from 200° C. to 450° C.

5. A process for producing a semiconductor device according to claim 1, wherein said cathode electrode comprises a bar-like shaped electrode, and said discharge chamber is made to have an inner pressure of 300 mTorr or less upon forming said i-type semiconductor layer.

6. A process for producing a semiconductor device according to claim 1, wherein said cathode electrode comprises a plate electrode, and said discharge chamber is made to have an inner pressure in a range of from 1 Torr to 10 Torr upon forming said i-type semiconductor layer.

7. A process for producing a semiconductor device according to claim 1, wherein said cathode electrode comprises a plate electrode, and a distance in a range of from 5 mm to 30 mm is established between said plate electrode and said substrate.

8. A process for producing a semiconductor device according to claim 1, wherein said VHF power applied is made to have a wattage which is 0.5 time or more that of a VHF power required for decomposing 100% of said silicon containing raw material gas.

9. A process for producing a semiconductor device according to claim 1, wherein prior to forming said i-type semiconductor layer on said substrate by means of VHF plasma CVD, an i-type semiconductor layer is previously formed on said substrate by other film-forming method which is different from said VHF plasma CVD.

10. A process for producing a semiconductor device according to claim 9, wherein said other film-forming method is an RF plasma CVD method.

11. A process for producing a semiconductor device according to claim 1, wherein said process is conducted using a multi-chambered plasma CVD apparatus comprising a plurality of film-forming chambers each having a cathode electrode therein and which are communicated with each other, wherein an elongated substrate is continuously moved to sequentially pass through said plurality of film-forming chambers while forming a semiconductor layer of a desired conduction type on said substrate by each film-forming chamber by means of plasma CVD, and said i-type semiconductor layer is formed by one of said plurality film-forming chambers by means of VHF plasma CVD by applying a VHF power of a wattage which is two times or less that of a VHF power required for decomposing 100% of said silicon-containing raw material gas is applied to said cathode electrode of said film-forming chamber.

* * * * *

UNITED STATES PATENT AND TRADEMARK OFFICE
CERTIFICATE OF CORRECTION

PATENT NO. : 6,495,392 B2
DATED : December 17, 2002
INVENTOR(S) : Akira Sakai et al.

It is certified that error appears in the above-identified patent and that said Letters Patent is hereby corrected as shown below:

Column 1,
Line 29, "mass-produced" should read -- mass-produced. --;
Line 50, "neither disconnection nor short" should read -- neither a disconnection nor a short --; and
Line 53, "current" should read -- current. --.

Column 3,
Line 63, "neither disconnection nor short" should read -- neither a disconnection nor a short --; and
Line 64, "are occurred" should read -- occur --.

Column 4,
Line 57, "the" should read -- in the --.

Column 8,
Line 56, "rage" should read -- range --.

Column 12,
Line 56, "be occurred" should read -- occur --.

Column 15,
Line 66, "below" should read -- below. --.

Column 16,
Line 1, "indicates" (first occurrence) should be deleted; and
Line 24, "vessel." should read -- vessel --.

Column 18,
Line 23, "shown)" should read -- shown). --; and
Line 24, "506." should read -- 506, --.

Column 19,
Line 50, "stacking" should read -- stack --.

UNITED STATES PATENT AND TRADEMARK OFFICE
CERTIFICATE OF CORRECTION

PATENT NO. : 6,495,392 B2
DATED : December 17, 2002
INVENTOR(S) : Akira Sakai et al.

It is certified that error appears in the above-identified patent and that said Letters Patent is hereby corrected as shown below:

Column 29,
Line 24, "the" should read -- this --; and
Line 59, "507:" should read -- 507; --.

Column 38,
Line 48, "plurality" should read -- plurality of --.

Signed and Sealed this

Sixteenth Day of December, 2003

JAMES E. ROGAN
*Director of the United States Patent and Trademark Office*